US010593341B2

(12) United States Patent
Atti et al.

(10) Patent No.: US 10,593,341 B2
(45) Date of Patent: *Mar. 17, 2020

(54) CODING OF MULTIPLE AUDIO SIGNALS

(71) Applicant: QUALCOMM Incorporated, San Diego, CA (US)

(72) Inventors: Venkatraman Atti, San Diego, CA (US); Venkata Subrahmanyam Chandra Sekhar Chebiyyam, Seattle, WA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/547,226

(22) Filed: Aug. 21, 2019

(65) Prior Publication Data

US 2019/0378523 A1 Dec. 12, 2019

Related U.S. Application Data

(63) Continuation of application No. 16/245,161, filed on Jan. 10, 2019, which is a continuation of application (Continued)

(51) Int. Cl.
*H03G 3/20* (2006.01)
*G10L 19/008* (2013.01)
(Continued)

(52) U.S. Cl.
CPC ............ *G10L 19/008* (2013.01); *H04S 3/008* (2013.01); *H04R 5/02* (2013.01); *H04S 2420/03* (2013.01)

(58) Field of Classification Search
CPC ............................ G10L 19/008; G10L 19/167
(Continued)

(56) References Cited

U.S. PATENT DOCUMENTS

| | | | |
|---|---|---|---|
| 10,217,468 | B2 | 2/2019 | Atti et al. |
| 2010/0169099 | A1 | 7/2010 | Ashley et al. |

(Continued)

FOREIGN PATENT DOCUMENTS

| | | | |
|---|---|---|---|
| EP | 2375409 | A1 | 10/2011 |
| EP | 3057095 | A1 | 8/2016 |
| WO | 2013149670 | A1 | 10/2013 |

OTHER PUBLICATIONS

International Search Report and Written Opinion—PCT/US2017/065542—ISA/EPO—dated Mar. 1, 2018.

(Continued)

*Primary Examiner* — Rasha S Al Aubaidi
(74) *Attorney, Agent, or Firm* — Moore Intellectual Property Law, PLLC

(57) ABSTRACT

A device includes a processor that is configured to determine an inter-channel mismatch value indicative of a temporal misalignment between a frequency-domain reference channel and a frequency-domain target channel. The processor is also configured to adjust the frequency-domain target channel based on the inter-channel mismatch value to generate an adjusted frequency-domain target channel. The processor is further configured to perform a down-mix operation, based on the frequency-domain reference channel and the adjusted frequency-domain target channel, to generate a mid channel and a side channel. The processor is also configured to generate a predicted side channel based on the mid channel. The processor is further configured to generate a residual channel based on the side channel and the predicted side channel. The processor is also configured to encode the residual channel as part of a bitstream.

30 Claims, 7 Drawing Sheets

Related U.S. Application Data

No. 15/836,604, filed on Dec. 8, 2017, now Pat. No. 10,217,468.

(60) Provisional application No. 62/448,287, filed on Jan. 19, 2017.

(51) Int. Cl.
*H04S 3/00* (2006.01)
*H04R 5/02* (2006.01)

(58) Field of Classification Search
USPC .......................... 381/1, 22–23; 704/500–504
See application file for complete search history.

(56) References Cited

U.S. PATENT DOCUMENTS

| | | | |
|---|---|---|---|
| 2010/0286990 | A1 | 11/2010 | Biswas et al. |
| 2018/0204578 | A1 | 7/2018 | Atti et al. |
| 2019/0147895 | A1 | 5/2019 | Atti et al. |

OTHER PUBLICATIONS

ITU-T, “7kHz Audio-Coding within 64 kbit/s: New Annex D with stereo embedded extension”, ITU-T Draft; Study Period 2009-2012, International Telecommunication Union, Geneva; CH, vol. 10/16, May 8, 2012 (May 8, 2015), XP044050906, pp. 1-52.

CODING OF MULTIPLE AUDIO SIGNALS

I. CROSS REFERENCE TO RELATED APPLICATIONS

The present application claims priority from and is a continuation of pending U.S. patent application Ser. No. 16/245,161, filed Jan. 10, 2019, and entitled “CODING OF MULTIPLE AUDIO SIGNALS,” which claims priority from and is a continuation of U.S. patent application Ser. No. 15/836,604, filed Dec. 8, 2017, now U.S. Pat. No. 10,217,468, and entitled “CODING OF MULTIPLE AUDIO SIGNALS,” which claims priority from U.S. Provisional Patent Application No. 62/448,287, entitled “CODING OF MULTIPLE AUDIO SIGNALS,” and filed Jan. 19, 2017, the contents of each of which are expressly incorporated by reference herein in their entirety.

II. FIELD

The present disclosure is generally related to coding (e.g., encoding or decoding) of multiple audio signals.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

A computing device may include or be coupled to multiple microphones to receive audio signals. Generally, a sound source is closer to a first microphone than to a second microphone of the multiple microphones. Accordingly, a second audio signal received from the second microphone may be delayed relative to a first audio signal received from the first microphone due to the respective distances of the microphones from the sound source. In other implementations, the first audio signal may be delayed with respect to the second audio signal. In stereo-encoding, audio signals from the microphones may be encoded to generate a mid channel signal and one or more side channel signals. The mid channel signal may correspond to a sum of the first audio signal and the second audio signal. A side channel signal may correspond to a difference between the first audio signal and the second audio signal. The first audio signal may not be aligned with the second audio signal because of the delay in receiving the second audio signal relative to the first audio signal. The misalignment (e.g., a temporal mismatch) of the first audio signal relative to the second audio signal may increase the difference between the two audio signals.

In situations where the temporal mismatch between a first channel and a second channel (e.g., a first signal and a second signal) is quite large, analysis and synthesis windows in a Discrete Fourier Transform (DFT) parameter estimation process tend to get mismatched undesirably.

IV. SUMMARY

In a particular implementation, a device includes a first transform unit configured to perform a first transform operation on a reference channel to generate a frequency-domain reference channel. The device also includes a second transform unit configured to perform a second transform operation on a target channel to generate a frequency-domain target channel. The device further includes a stereo channel adjustment unit configured to determine an inter-channel mismatch value indicative of a temporal misalignment between the frequency-domain reference channel and the frequency-domain target channel. The stereo channel adjustment unit is also configured to adjust the frequency-domain target channel based on the inter-channel mismatch value to generate an adjusted frequency-domain target channel. The device also includes a down-mixer configured to perform a down-mix operation on the frequency-domain reference channel and the adjusted frequency-domain target channel to generate a mid channel and a side channel. The device further includes a residual generation unit configured to generate a predicted side channel based on the mid channel. The predicted side channel corresponds to a prediction of the side channel. The residual generation unit is also configured to generate a residual channel based on the side channel and the predicted side channel. The device also includes a residual scaling unit configured to determine a scaling factor for the residual channel based on the inter-channel mismatch value. The residual scaling unit is also configured to scale the residual channel by the scaling factor to generate a scaled residual channel. The device also includes a mid channel encoder configured to encode the mid channel as part of a bitstream. The device further includes a residual channel encoder configured to encode the scaled residual channel as part of the bitstream.

In another particular implementation, a method of communication includes performing, at an encoder, a first transform operation on a reference channel to generate a frequency-domain reference channel. The method also includes performing a second transform operation on a target channel to generate a frequency-domain target channel. The method also includes determining an inter-channel mismatch value indicative of a temporal misalignment between the frequency-domain reference channel and the frequency-domain target channel. The method further includes adjusting the frequency-domain target channel based on the inter-channel mismatch value to generate an adjusted frequency-domain target channel. The method also includes performing a down-mix operation on the frequency-domain reference channel and the adjusted frequency-domain target channel to generate a mid channel and a side channel. The method further includes generating a predicted side channel based on the mid channel. The predicted side channel corresponds to a prediction of the side channel. The method also includes generating a residual channel based on the side channel and the predicted side channel. The method further includes determining a scaling factor for the residual channel based on the inter-channel mismatch value. The method also includes scaling the residual channel by the scaling factor to generate a scaled residual channel. The method further includes encoding the mid channel and the scaled residual channel as part of a bitstream.

In another particular implementation, a non-transitory computer-readable medium includes instructions that, when executed by a processor within an encoder, cause the processor to perform operations including performing a first transform operation on a reference channel to generate a frequency-domain reference channel. The operations also include performing a second transform operation on a target channel to generate a frequency-domain target channel. The operations also include determining an inter-channel mismatch value indicative of a temporal misalignment between the frequency-domain reference channel and the frequency-domain target channel. The operations also include adjusting the frequency-domain target channel based on the inter-channel mismatch value to generate an adjusted frequency-domain target channel. The operations also include performing a down-mix operation on the frequency-domain reference channel and the adjusted frequency-domain target channel to generate a mid channel and a side channel. The operations also include generating a predicted side channel based on the mid channel. The predicted side channel corresponds to a prediction of the side channel. The operations also include generating a residual channel based on the side channel and the predicted side channel. The operations also include determining a scaling factor for the residual channel based on the inter-channel mismatch value. The operations also include scaling the residual channel by the scaling factor to generate a scaled residual channel. The operations also include encoding the mid channel and the scaled residual channel as part of a bitstream.

In another particular implementation, an apparatus include means for performing a first transform operation on a reference channel to generate a frequency-domain reference channel. The apparatus also includes means for performing a second transform operation on a target channel to generate a frequency-domain target channel. The apparatus also includes means for determining an inter-channel mismatch value indicative of a temporal misalignment between the frequency-domain reference channel and the frequency-domain target channel. The apparatus also includes means for adjusting the frequency-domain target channel based on the inter-channel mismatch value to generate an adjusted frequency-domain target channel. The apparatus also includes means for performing a down-mix operation on the frequency-domain reference channel and the adjusted frequency-domain target channel to generate a mid channel and a side channel. The apparatus also includes means for generating a predicted side channel based on the mid channel. The predicted side channel corresponds to a prediction of the side channel. The apparatus also includes means for generating a residual channel based on the side channel and the predicted side channel. The apparatus also includes means for determining a scaling factor for the residual channel based on the inter-channel mismatch value. The apparatus also includes means for scaling the residual channel by the scaling factor to generate a scaled residual channel. The apparatus also includes means for encoding the mid channel and the scaled residual channel as part of a bitstream.

Other implementations, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 5:
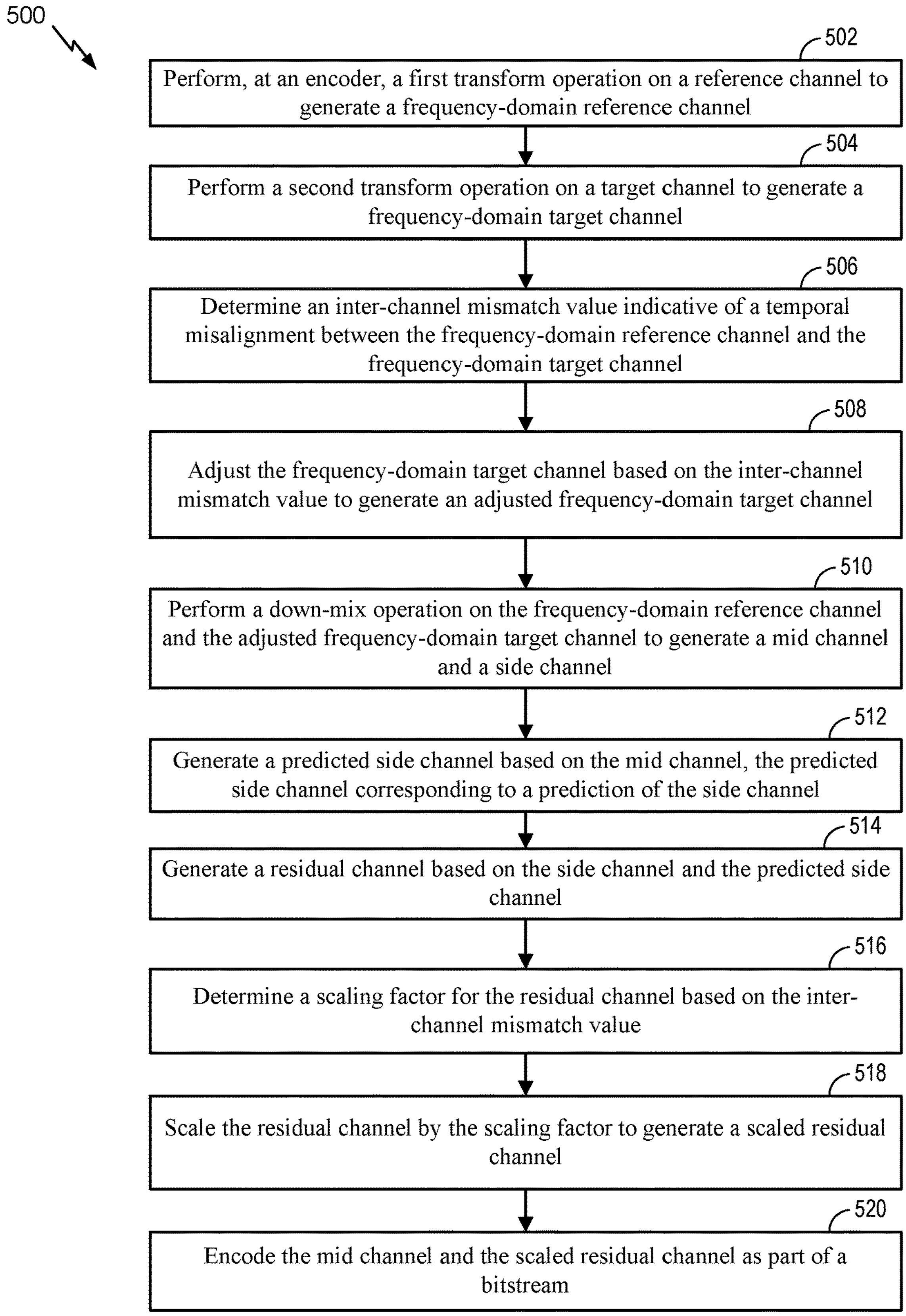
Figure 6:
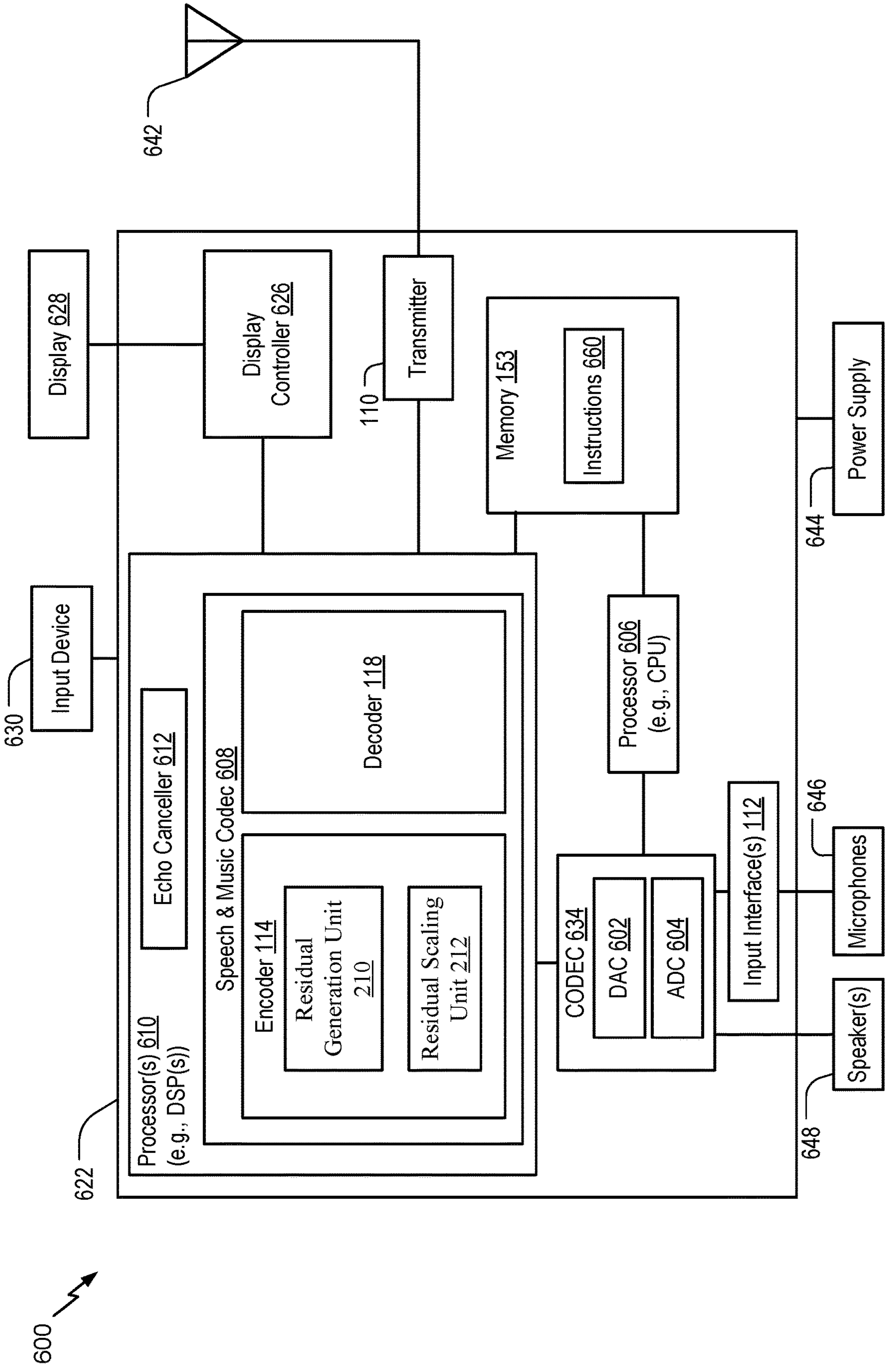
Figure 7:
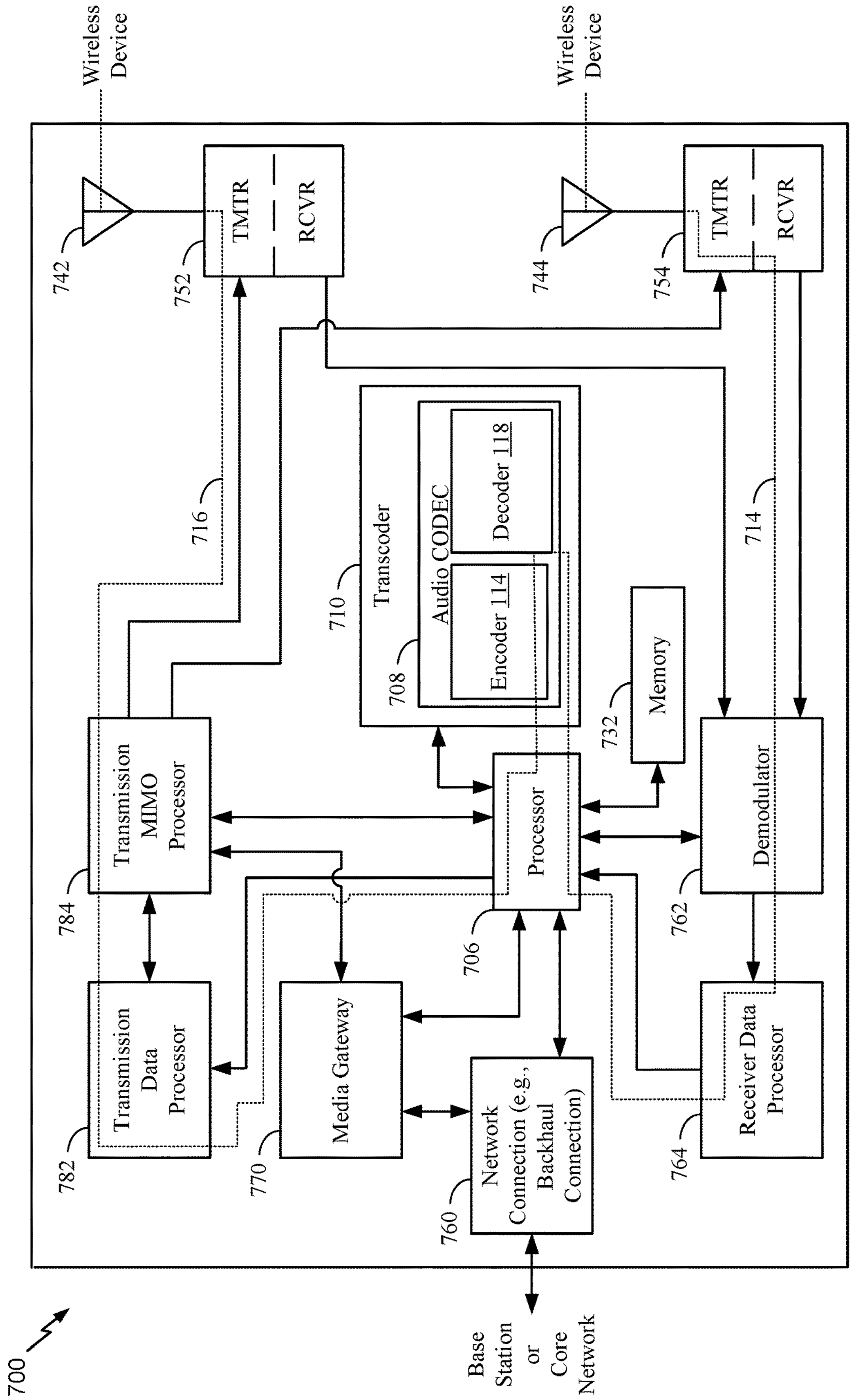

FIG. 5 includes a flow chart illustrating a method of decoding audio signals;

FIG. 6 is a block diagram of a particular illustrative example of a device that is operable to encode multiple audio signals; and FIG. 7 is a block diagram of a particular illustrative example of a base station that is operable to encode multiple audio signals.

VI. DETAILED DESCRIPTION

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. It may be further understood that the terms "comprises" and "comprising" may be used interchangeably with "includes" or "including." Additionally, it will be understood that the term "wherein" may be used interchangeably with "where." As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

In the present disclosure, terms such as "determining", "calculating", "shifting", "adjusting", etc. may be used to describe how one or more operations are performed. It should be noted that such terms are not to be construed as limiting and other techniques may be utilized to perform similar operations. Additionally, as referred to herein, "generating", "calculating", "using", "selecting", "accessing", and "determining" may be used interchangeably. For example, "generating", "calculating", or "determining" a parameter (or a signal) may refer to actively generating, calculating, or determining the parameter (or the signal) or may refer to using, selecting, or accessing the parameter (or signal) that is already generated, such as by another component or device.

Systems and devices operable to encode multiple audio signals are disclosed. A device may include an encoder configured to encode the multiple audio signals. The multiple audio signals may be captured concurrently in time using multiple recording devices, e.g., multiple microphones. In some examples, the multiple audio signals (or multi-channel audio) may be synthetically (e.g., artificially) generated by multiplexing several audio channels that are recorded at the same time or at different times. As illustrative examples, the concurrent recording or multiplexing of the audio channels may result in a 2-channel configuration (i.e., Stereo: Left and Right), a 5.1 channel configuration (Left, Right, Center, Left Surround, Right Surround, and the low frequency emphasis (LFE) channels), a 7.1 channel configuration, a 7.1+4 channel configuration, a 22.2 channel configuration, or a N-channel configuration.

Audio capture devices in teleconference rooms (or telepresence rooms) may include multiple microphones that acquire spatial audio. The spatial audio may include speech as well as background audio that is encoded and transmitted. The speech/audio from a given source (e.g., a talker) may arrive at the multiple microphones at different times depending on how the microphones are arranged as well as where the source (e.g., the talker) is located with respect to the microphones and room dimensions. For example, a sound source (e.g., a talker) may be closer to a first microphone associated with the device than to a second microphone associated with the device. Thus, a sound emitted from the sound source may reach the first microphone earlier in time than the second microphone. The device may receive a first audio signal via the first microphone and may receive a second audio signal via the second microphone.

Mid-side (MS) coding and parametric stereo (PS) coding are stereo coding techniques that may provide improved efficiency over the dual-mono coding techniques. In dual-mono coding, the Left (L) channel (or signal) and the Right (R) channel (or signal) are independently coded without making use of inter-channel correlation. MS coding reduces the redundancy between a correlated L/R channel-pair by transforming the Left channel and the Right channel to a sum-channel and a difference-channel (e.g., a side channel) prior to coding. The sum signal and the difference signal are waveform coded or coded based on a model in MS coding. Relatively more bits are spent on the sum signal than on the side signal. PS coding reduces redundancy in each sub-band by transforming the L/R signals into a sum signal and a set of side parameters. The side parameters may indicate an inter-channel intensity difference (IID), an inter-channel phase difference (IPD), an inter-channel time difference (ITD), side or residual prediction gains, etc. The sum signal is waveform coded and transmitted along with the side parameters. In a hybrid system, the side-channel may be waveform coded in the lower bands (e.g., less than 2 kilohertz (kHz)) and PS coded in the upper bands (e.g., greater than or equal to 2 kHz) where the inter-channel phase preservation is perceptually less critical. In some implementations, the PS coding may be used in the lower bands also to reduce the inter-channel redundancy before waveform coding.

The MS coding and the PS coding may be done in either the frequency-domain or in the sub-band domain. In some examples, the Left channel and the Right channel may be uncorrelated. For example, the Left channel and the Right channel may include uncorrelated synthetic signals. When the Left channel and the Right channel are uncorrelated, the coding efficiency of the MS coding, the PS coding, or both, may approach the coding efficiency of the dual-mono coding.

Depending on a recording configuration, there may be a temporal mismatch between a Left channel and a Right channel, as well as other spatial effects such as echo and room reverberation. If the temporal mismatch and phase mismatch between the channels are not compensated, the sum channel and the difference channel may contain comparable energies reducing the coding-gains associated with MS or PS techniques. The reduction in the coding-gains may be based on the amount of temporal (or phase) mismatch. The comparable energies of the sum signal and the difference signal may limit the usage of MS coding in certain frames where the channels are temporally mismatched but are highly correlated. In stereo coding, a Mid channel (e.g., a sum channel) and a Side channel (e.g., a difference channel) may be generated based on the following Formula:

$$M=(L+R)/2,\ S=(L-R)/2, \qquad \text{Formula 1}$$

where M corresponds to the Mid channel, S corresponds to the Side channel, L corresponds to the Left channel, and R corresponds to the Right channel.

In some cases, the Mid channel and the Side channel may be generated based on the following Formula:

$$M=c(L+R),\ S=c(L-R), \qquad \text{Formula 2}$$

where c corresponds to a complex value which is frequency dependent.

Generating the Mid channel and the Side channel based on Formula 1 or Formula 2 may be referred to as "downmixing". A reverse process of generating the Left channel and the Right channel from the Mid channel and the Side channel based on Formula 1 or Formula 2 may be referred to as "upmixing".

In some cases, the Mid channel may be based other formulas such as:

$$M=(L+g_D R)/2, \text{ or} \qquad \text{Formula 3}$$

$$M=g_1 L+g_2 R \qquad \text{Formula 4}$$

where $g_1+g_2=1.0$, and where $g_D$ is a gain parameter. In other examples, the downmix may be performed in bands, where mid(b)=$c_1$L(b)+$c_2$R(b), where $c_1$ and $c_2$ are complex numbers, where side(b)=$c_3$L(b)−$c_4$R(b), and where $c_3$ and $c_4$ are complex numbers.

An ad-hoc approach used to choose between MS coding or dual-mono coding for a particular frame may include generating a mid signal and a side signal, calculating energies of the mid signal and the side signal, and determining whether to perform MS coding based on the energies. For example, MS coding may be performed in response to determining that the ratio of energies of the side signal and the mid signal is less than a threshold. To illustrate, if a Right channel is shifted by at least a first time (e.g., about 0.001 seconds or 48 samples at 48 kHz), a first energy of the mid signal (corresponding to a sum of the left signal and the right signal) may be comparable to a second energy of the side signal (corresponding to a difference between the left signal and the right signal) for voiced speech frames. When the first energy is comparable to the second energy, a higher number of bits may be used to encode the Side channel, thereby reducing coding efficiency of MS coding relative to dual-mono coding. Dual-mono coding may thus be used when the first energy is comparable to the second energy (e.g., when the ratio of the first energy and the second energy is greater than or equal to the threshold). In an alternative approach, the decision between MS coding and dual-mono coding for a particular frame may be made based on a comparison of a threshold and normalized cross-correlation values of the Left channel and the Right channel.

In some examples, the encoder may determine a mismatch value indicative of an amount of temporal mismatch between the first audio signal and the second audio signal. As used herein, a "temporal shift value", a "shift value", and a "mismatch value" may be used interchangeably. For example, the encoder may determine a temporal shift value indicative of a shift (e.g., the temporal mismatch) of the first audio signal relative to the second audio signal. The mismatch value may correspond to an amount of temporal mismatch between receipt of the first audio signal at the first microphone and receipt of the second audio signal at the second microphone. Furthermore, the encoder may determine the mismatch value on a frame-by-frame basis, e.g., based on each 20 milliseconds (ms) speech/audio frame. For example, the mismatch value may correspond to an amount of time that a second frame of the second audio signal is delayed with respect to a first frame of the first audio signal. Alternatively, the mismatch value may correspond to an amount of time that the first frame of the first audio signal is delayed with respect to the second frame of the second audio signal.

When the sound source is closer to the first microphone than to the second microphone, frames of the second audio signal may be delayed relative to frames of the first audio signal. In this case, the first audio signal may be referred to as the "reference audio signal" or "reference channel" and the delayed second audio signal may be referred to as the "target audio signal" or "target channel". Alternatively, when the sound source is closer to the second microphone than to the first microphone, frames of the first audio signal may be delayed relative to frames of the second audio signal. In this case, the second audio signal may be referred to as the reference audio signal or reference channel and the delayed first audio signal may be referred to as the target audio signal or target channel.

Depending on where the sound sources (e.g., talkers) are located in a conference or telepresence room or how the sound source (e.g., talker) position changes relative to the microphones, the reference channel and the target channel may change from one frame to another; similarly, the temporal mismatch value may also change from one frame to another. However, in some implementations, the temporal mismatch value may always be positive to indicate an amount of delay of the "target" channel relative to the "reference" channel. Furthermore, the temporal mismatch value may be used to determine a "non-causal shift" value (referred to herein as a "shift value") by which the delayed target channel is "pulled back" in time such that the target channel is aligned (e.g., maximally aligned) with the "reference" channel. The downmix algorithm to determine the mid channel and the side channel may be performed on the reference channel and the non-causal shifted target channel.

The encoder may determine the temporal mismatch value based on the reference audio channel and a plurality of temporal mismatch values applied to the target audio channel. For example, a first frame of the reference audio channel, X, may be received at a first time ($m_1$). A first particular frame of the target audio channel, Y, may be received at a second time ($n_1$) corresponding to a first temporal mismatch value, e.g., mismatch1=$n_1-m_1$. Further, a second frame of the reference audio channel may be received at a third time ($m_2$). A second particular frame of the target audio channel may be received at a fourth time ($n_2$) corresponding to a second temporal mismatch value, e.g., mismatch2=$n_2-m_2$.

The device may perform a framing or a buffering algorithm to generate a frame (e.g., 20 ms samples) at a first sampling rate (e.g., 32 kHz sampling rate (i.e., 640 samples per frame)). The encoder may, in response to determining that a first frame of the first audio signal and a second frame of the second audio signal arrive at the same time at the device, estimate a shift value (e.g., shift1) as equal to zero samples. A Left channel (e.g., corresponding to the first audio signal) and a Right channel (e.g., corresponding to the second audio signal) may be temporally aligned. In some cases, the Left channel and the Right channel, even when aligned, may differ in energy due to various reasons (e.g., microphone calibration).

In some examples, the Left channel and the Right channel may be temporally misaligned due to various reasons (e.g., a sound source, such as a talker, may be closer to one of the microphones than another and the two microphones may be greater than a threshold (e.g., 1-20 centimeters) distance apart). A location of the sound source relative to the microphones may introduce different delays in the first channel and the second channel. In addition, there may be a gain difference, an energy difference, or a level difference between the first channel and the second channel.

In some example, where there are more than two channels, a reference channel is initially selected based on the levels or energy of the channels, and subsequently refined based on the temporal mismatch values between different pairs of the channels, e.g., t1(ref, ch2), t2(ref, ch3), t3(ref, ch4), . . . t3(ref, chN), where ch1 is the ref channel initially and t1(.), t2(.), etc., are the functions to estimate the mismatch values. If all temporal mismatch values are positive, then ch1 is treated as the reference channel. Alternatively, if any of the mismatch values is a negative value, then the reference channel is reconfigured to a channel that was associated with a mismatch value that resulted in a negative value and the above process is continued until the best selection (i.e., based on maximally decorrelating maximum number of side channels) of the reference channel is achieved. A hysteresis may be used to overcome any sudden variations in reference channel selection.

In some examples, a time of arrival of audio signals at the microphones from multiple sound sources (e.g., talkers) may vary when the multiple talkers are alternatively talking (e.g., without overlap). In such a case, the encoder may dynamically adjust a temporal mismatch value based on the talker to identify the reference channel. In some other examples, the multiple talkers may be talking at the same time, which may result in varying temporal mismatch values depending on who is the loudest talker, closest to the microphone, etc. In such a case, identification of reference and target channels may be based on the varying temporal shift values in the current frame and the estimated temporal mismatch values in the previous frames, and based on the energy or temporal evolution of the first and second audio signals.

In some examples, the first audio signal and second audio signal may be synthesized or artificially generated when the two signals potentially show less (e.g., no) correlation. It should be understood that the examples described herein are illustrative and may be instructive in determining a relationship between the first audio signal and the second audio signal in similar or different situations.

The encoder may generate comparison values (e.g., difference values or cross-correlation values) based on a comparison of a first frame of the first audio signal and a plurality of frames of the second audio signal. Each frame of the plurality of frames may correspond to a particular temporal mismatch value. The encoder may generate a first estimated shift value based on the comparison values. For example, the first estimated shift value may correspond to a comparison value indicating a higher temporal-similarity (or lower difference) between the first frame of the first audio signal and a corresponding first frame of the second audio signal.

The encoder may determine a final shift value by refining, in multiple stages, a series of estimated shift values. For example, the encoder may first estimate a "tentative" shift value based on comparison values generated from stereo pre-processed and re-sampled versions of the first audio signal and the second audio signal. The encoder may generate interpolated comparison values associated with shift values proximate to the estimated "tentative" shift value. The encoder may determine a second estimated "interpolated" shift value based on the interpolated comparison values. For example, the second estimated "interpolated" shift value may correspond to a particular interpolated comparison value that indicates a higher temporal-similarity (or lower difference) than the remaining interpolated comparison values and the first estimated "tentative" shift value. If the second estimated "interpolated" shift value of the current frame (e.g., the first frame of the first audio signal) is different than a final shift value of a previous frame (e.g., a frame of the first audio signal that precedes the first frame), then the "interpolated" shift value of the current frame is further "amended" to improve the temporal-similarity between the first audio signal and the shifted second audio signal. In particular, a third estimated "amended" shift value may correspond to a more accurate measure of temporal-similarity by searching around the second estimated "interpolated" shift value of the current frame and the final estimated shift value of the previous frame. The third estimated "amended" shift value is further conditioned to estimate the final shift value by limiting any spurious changes in the shift value between frames and further controlled to not switch from a negative shift value to a positive shift value (or vice versa) in two successive (or consecutive) frames as described herein.

In some examples, the encoder may refrain from switching between a positive shift value and a negative shift value or vice-versa in consecutive frames or in adjacent frames. For example, the encoder may set the final shift value to a particular value (e.g., 0) indicating no temporal-shift based on the estimated "interpolated" or "amended" shift value of the first frame and a corresponding estimated "interpolated" or "amended" or final shift value in a particular frame that precedes the first frame. To illustrate, the encoder may set the final shift value of the current frame (e.g., the first frame) to indicate no temporal-shift, i.e., shift1=0, in response to determining that one of the estimated "tentative" or "interpolated" or "amended" shift value of the current frame is positive and the other of the estimated "tentative" or "interpolated" or "amended" or "final" estimated shift value of the previous frame (e.g., the frame preceding the first frame) is negative. Alternatively, the encoder may also set the final shift value of the current frame (e.g., the first frame) to indicate no temporal-shift, i.e., shift1=0, in response to determining that one of the estimated "tentative" or "interpolated" or "amended" shift value of the current frame is negative and the other of the estimated "tentative" or "interpolated" or "amended" or "final" estimated shift value of the previous frame (e.g., the frame preceding the first frame) is positive.

The encoder may select a frame of the first audio signal or the second audio signal as a "reference" or "target" based on the shift value. For example, in response to determining that the final shift value is positive, the encoder may generate a reference channel or signal indicator having a first value (e.g., 0) indicating that the first audio signal is a "reference" signal and that the second audio signal is the "target" signal. Alternatively, in response to determining that the final shift value is negative, the encoder may generate the reference channel or signal indicator having a second value (e.g., 1) indicating that the second audio signal is the "reference" signal and that the first audio signal is the "target" signal.

The encoder may estimate a relative gain (e.g., a relative gain parameter) associated with the reference signal and the non-causal shifted target signal. For example, in response to determining that the final shift value is positive, the encoder may estimate a gain value to normalize or equalize the energy or power levels of the first audio signal relative to the second audio signal that is offset by the non-causal shift value (e.g., an absolute value of the final shift value). Alternatively, in response to determining that the final shift value is negative, the encoder may estimate a gain value to normalize or equalize the power or amplitude levels of the non-causal shifted first audio signal relative to the second audio signal. In some examples, the encoder may estimate a gain value to normalize or equalize the amplitude or power levels of the "reference" signal relative to the non-causal shifted "target" signal. In other examples, the encoder may estimate the gain value (e.g., a relative gain value) based on the reference signal relative to the target signal (e.g., the unshifted target signal).

The encoder may generate at least one encoded signal (e.g., a mid channel signal, a side channel signal, or both) based on the reference signal, the target signal, the non-causal shift value, and the relative gain parameter. In other implementations, the encoder may generate at least one encoded signal (e.g., a mid channel, a side channel, or both) based on the reference channel and the temporal-mismatch adjusted target channel. The side signal may correspond to a difference between first samples of the first frame of the first audio signal and selected samples of a selected frame of the second audio signal. The encoder may select the selected frame based on the final shift value. Fewer bits may be used to encode the side channel signal because of reduced difference between the first samples and the selected samples as compared to other samples of the second audio signal that correspond to a frame of the second audio signal that is received by the device at the same time as the first frame. A transmitter of the device may transmit the at least one encoded signal, the non-causal shift value, the relative gain parameter, the reference channel or signal indicator, or a combination thereof.

The encoder may generate at least one encoded signal (e.g., a mid signal, a side signal, or both) based on the reference signal, the target signal, the non-causal shift value, the relative gain parameter, low band parameters of a particular frame of the first audio signal, high band parameters of the particular frame, or a combination thereof. The particular frame may precede the first frame. Certain low band parameters, high band parameters, or a combination thereof, from one or more preceding frames may be used to encode a mid signal, a side signal, or both, of the first frame. Encoding the mid signal, the side signal, or both, based on the low band parameters, the high band parameters, or a combination thereof, may include estimates of the non-causal shift value and inter-channel relative gain parameter. The low band parameters, the high band parameters, or a combination thereof, may include a pitch parameter, a voicing parameter, a coder type parameter, a low-band energy parameter, a high-band energy parameter, a tilt parameter, a pitch gain parameter, a FCB gain parameter, a coding mode parameter, a voice activity parameter, a noise estimate parameter, a signal-to-noise ratio parameter, a formant shaping parameter, a speech/music decision parameter, the non-causal shift, the inter-channel gain parameter, or a combination thereof. A transmitter of the device may transmit the at least one encoded signal, the non-causal shift value, the relative gain parameter, the reference channel (or signal) indicator, or a combination thereof. In the present disclosure, terms such as "determining", "calculating", "shifting", "adjusting", etc. may be used to describe how one or more operations are performed. It should be noted that such terms are not to be construed as limiting and other techniques may be utilized to perform similar operations.

In the present disclosure, systems and devices operable to modify or code a residual channel (e.g., a side channel (or signal) or an error channel (or signal)) signals are disclosed.

For example, the residual channel may be modified or encoded based on a temporal misalignment or mismatch value between a target channel and a reference channel to reduce inter-harmonic noise introduced by windowing effects in a signal-adaptive "flexible" stereo coder. The signal-adaptive "flexible" stereo coder may transform one or more time-domain signals (e.g., the reference channel and the adjusted target channel) into frequency-domain signals. Window mismatch in analysis-synthesis may result in pronounced inter-harmonic noise or spectral leakage in the side channel estimated in the downmix process.

Some encoders improve temporal alignment of two channels by shifting both channels. For example, a first channel may be causally shifted by half of the mismatch amount, and a second channel may be non-causally shifted by half of the mismatch amount, resulting in a temporal alignment of the two channels. However, proposed systems use only non-causal shifting of one channel to improve temporal alignment of the channels. For example, a target channel (e.g., a lagging channel), can be non-causally shifted in order to align the reference channel and the target channel. Since only the target channel is shifted to temporally align the channels, the target channel is shifted by a larger amount than it would be if both causal and non-causal shifts were used to align the channels. When one channel, i.e., the target channel, is the only channel shifted based on a determined mismatch value, a mid channel and a side channel (obtained from downmixing the first channel and the second channel) will demonstrate an increase in inter-harmonic noise or spectral leakage. This inter-harmonic noise (e.g., artifacts) is more dominant in the side channel, when window rotation (e.g., the amount of non-causal shift) is quite large (e.g., greater than 1-2 ms).

The target channel shift can be performed in the time domain or in the frequency domain. If the target channel is shifted in the time domain, the shifted target channel and the reference channel are subjected to DFT analysis, using an analysis window, to transform the shifted target channel and the reference channel to the frequency domain. Alternatively, if the target channel is shifted in the frequency domain, the target channel (before shifting) and the reference channel may be subjected to DFT analysis, using the analysis window, to transform the target channel and the reference channel to the frequency domain, and the target channel is shifted (using phase rotation operations) after the DFT analysis. In either case, after shifting and DFT analysis, frequency domain versions of the shifted target channel and the reference channel are downmixed to generate a mid channel and a side channel. In some implementations, an error channel may be generated. The error channel indicates differences between the side channel and an estimated side channel that is determined based on the mid channel. The term "residual channel" is used herein to refer to the side channel or to the error channel. Subsequently, the DFT synthesis is performed, using a synthesis window, to transform signals to be transmitted (e.g., the mid channel and the residual channel) back into the time domain.

To avoid introducing artifacts, the synthesis window should match the analysis window. However, when the temporal misalignment of the target and reference channel is large, aligning the target and reference channel using only non-causal shifting of the target channel can cause a large mismatch between the synthesis window and the analysis window corresponding to the target channel which is a part of the residual channel. Artifacts introduced by this window mismatch are prevalent in the residual channel.

The residual channel can be modified to reduce these artifacts. In one example, the residual channel can be attenuated (e.g., by applying a gain to the side channel or by applying a gain to the error channel) before generating a bit stream for transmission. The residual channel can be completely attenuated, e.g., zeroed, or only partially attenuated. As another example, a number of bits used to encode the residual channel in the bit stream can be modified. For example, when the temporal misalignment between the target channel and the reference channel is small (e.g., below a threshold), a first number of bits may be allocated for transmission of residual channel information. However, when the temporal misalignment between the target channel and the reference channel is large (e.g., greater a threshold), a second number of bits may be allocated for transmission of residual channel information, where the second number is smaller than the first number.

Figure 1:
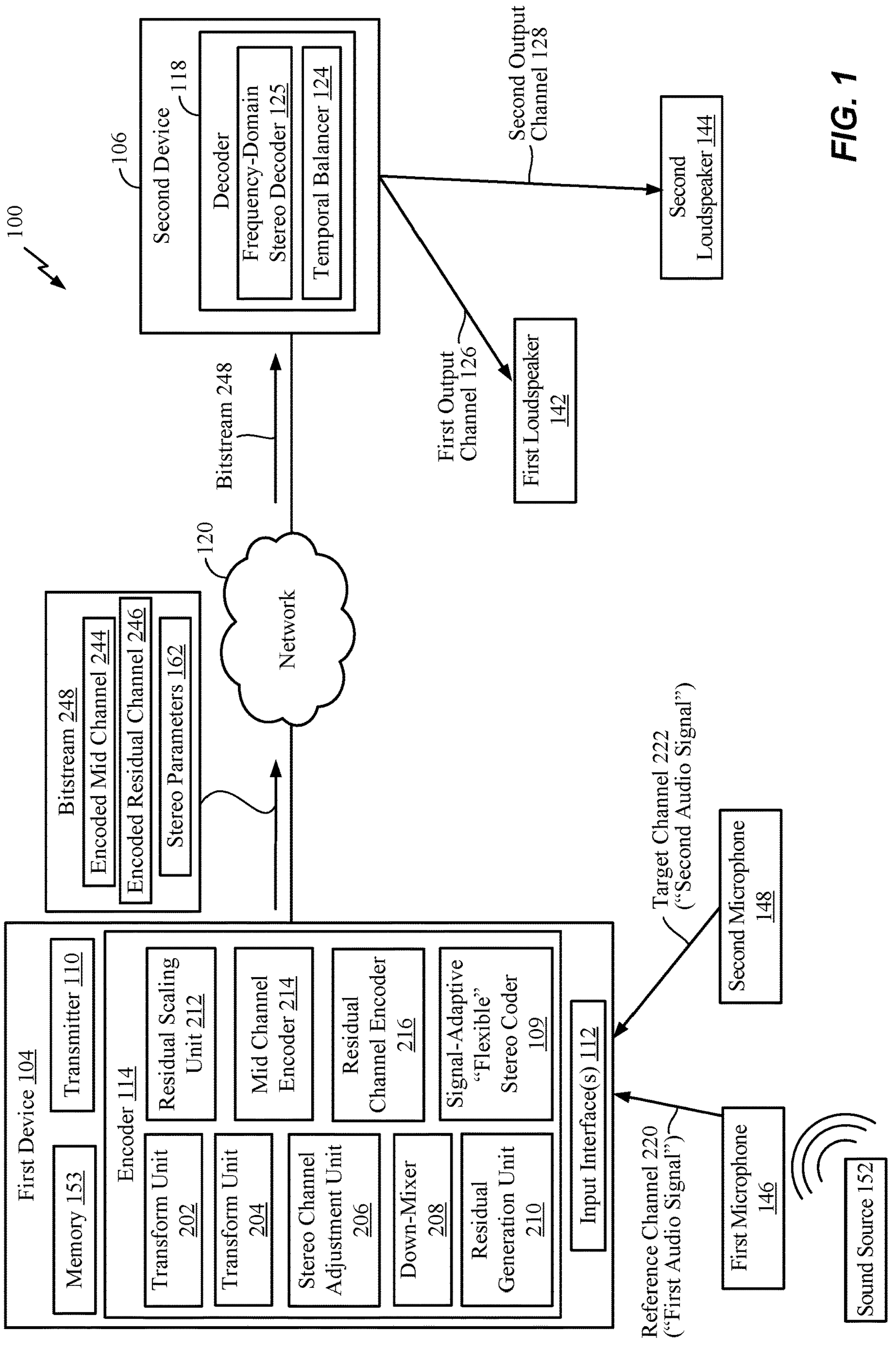
FIG. 1 is a block diagram of a particular illustrative example of a system that includes an encoder operable to encode multiple audio signals.

Referring to FIG. 1, a particular illustrative example of a system is disclosed and generally designated 100. The system 100 includes a first device 104 communicatively coupled, via a network 120, to a second device 106. The network 120 may include one or more wireless networks, one or more wired networks, or a combination thereof.

The first device 104 may include an encoder 114, a transmitter 110, and one or more input interfaces 112. At least one input interface of the input interfaces 112 may be coupled to a first microphone 146, and at least one other input interface of the input interface 112 may be coupled to a second microphone 148. The encoder 114 may include a transform unit 202, a transform unit 204, a stereo channel adjustment unit 206, a down-mixer 208, a residual generation unit 210, a residual scaling unit 212 (e.g., a residual channel modifier), a mid channel encoder 214, a residual channel encoder 216, and a signal-adaptive "flexible" stereo coder 109. The signal-adaptive "flexible" stereo coder 109 may include a time-domain (TD) coder, a frequency-domain (FD) coder, or modified discrete cosine transform (MDCT) domain coder. Residual signal or error signal modifications described herein may be applicable to each stereo downmix mode (e.g., a TD downmix mode, a FD downmix mode, or a MDCT downmix mode). The first device 104 may also include a memory 153 configured to store analysis data.

The second device 106 may include a decoder 118. The decoder 118 may include a temporal balancer 124 and a frequency-domain stereo decoder 125. The second device 106 may be coupled to a first loudspeaker 142, a second loudspeaker 144, or both.

During operation, the first device 104 may receive a reference channel 220 (e.g., a first audio signal) via the first input interface from the first microphone 146 and may receive a target channel 222 (e.g., a second audio signal) via the second input interface from the second microphone 148. The reference channel 220 may correspond to a channel leading in time (e.g., a leading channel), and the target channel 222 may correspond to a channel lagging in time (e.g., a lagging channel). For example, a sound source 152 (e.g., a user, a speaker, ambient noise, a musical instrument, etc.) may be closer to the first microphone 146 than to the second microphone 148. Accordingly, an audio signal from the sound source 152 may be received at the input interfaces 112 via the first microphone 146 at an earlier time than via the second microphone 148. This natural delay in the multi-channel signal acquisition through the multiple microphones may introduce a temporal misalignment between the first audio channel 130 and the second audio channel 132. The reference channel 220 may be a right channel or a left channel, and the target channel 222 may be the other of the right channel or the left channel.

Figure 2:
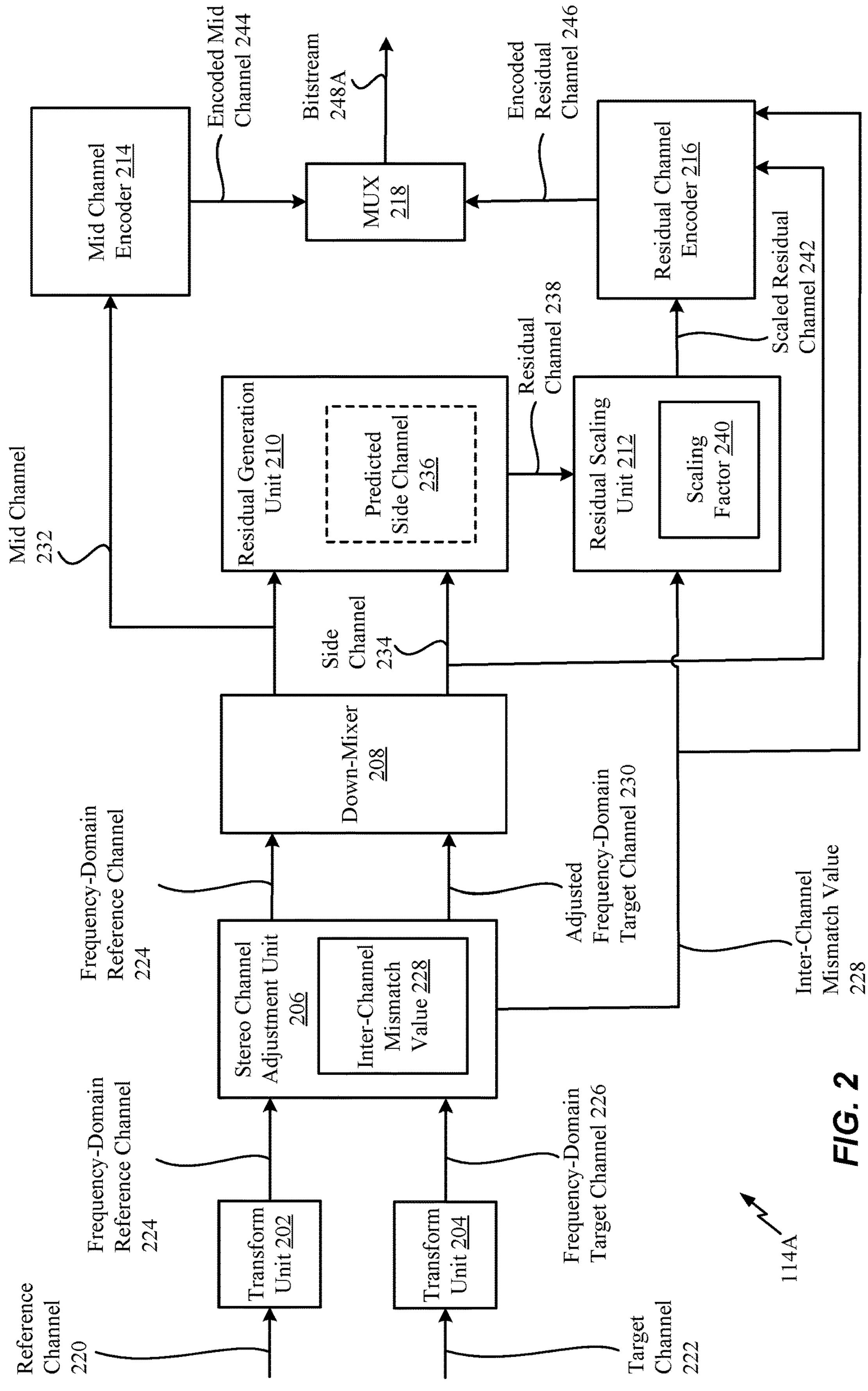
FIG. 2 is a diagram illustrating an example of the encoder of FIG. 1.

As described in greater detail with respect to FIG. 2, the target channel 222 may be adjusted (e.g., temporally shifted) to substantially align with the reference channel 220. According to one implementation, the reference channel 220 and the target channel 222 may vary on a frame-to-frame basis.

Referring to FIG. 2, an example of an encoder 114A is shown. The encoder 114A may correspond to the encoder 114 of FIG. 1. The encoder 114*a* includes the transform unit 202, the transform unit 204, the stereo channel adjustment unit 206, the down-mixer 208, the residual generation unit 210, the residual scaling unit 212, the mid channel encoder 214, and the residual channel encoder 216.

The reference channel 220 captured by the first microphone 146 is provided to the transform unit 202. The transform unit 202 is configured to perform a first transform operation on the reference channel 220 to generate a frequency-domain reference channel 224. For example, the first transform operation may include one or more Discrete Fourier Transform (DFT) operations, Fast Fourier Transform (FFT) operations, modified discrete cosine transform (MDCT) operations, etc. According to some implementations, Quadrature Mirror Filterbank (QMF) operations (using filterbands, such as a Complex Low Delay Filter Bank) may be used to split the reference channel 220 into multiple sub-bands. The frequency-domain reference channel 224 is provided to the stereo channel adjustment unit 206.

The target channel 222 captured by the second microphone 148 is provided to the transform unit 204. The transform unit 204 is configured to perform a second transform operation on the target channel 222 to generate a frequency-domain target channel 226. For example, the second transform operation may include DFT operations, FFT operations, MDCT operations, etc. According to some implementations, QMF operations may be used to split the target channel 222 into multiple sub-bands. The frequency-domain target channel 226 is also provided to the stereo channel adjustment unit 206.

In some alternative implementations, there may be additional processing steps performed on the reference and target channels captured by the microphones prior to performing the transform operations. For instance, in one implementation, the channels may be shifted (e.g., causally, non-causally, or both) in the time domain to be aligned with each other based on the mismatch value estimated in a previous frame. Then, the transform operation is performed on the shifted channels.

The stereo channel adjustment unit 206 is configured to determine an inter-channel mismatch value 228 that is indicative of a temporal misalignment between the frequency-domain reference channel 224 and the frequency-domain target channel 226. Thus, the inter-channel mismatch value 228 may be an inter-channel time difference (ITD) parameter that indicates (in a frequency domain) how much the target channel 222 lags the reference channel 220. The stereo channel adjustment unit 206 is further configured to adjust the frequency-domain target channel 226 based on the inter-channel mismatch value 228 to generate an adjusted frequency-domain target channel 230. For example, the stereo channel adjustment unit 206 may shift the frequency-domain target channel 226 by the inter-channel mismatch value 228 to generate the adjusted frequency-domain target channel 230 that is temporally in synchronization with the frequency-domain reference channel 224. The frequency-domain reference channel 224 is passed along to the down-mixer 208, and the adjusted frequency-domain target channel 230 is provided to the down-mixer 208. The inter-channel mismatch value 228 is provided to the residual scaling unit 212.

The down-mixer 208 is configured to perform a down-mix operation on the frequency-domain reference channel 224 and the adjusted frequency-domain target channel 230 to generate a mid channel 232 and a side channel 234. The mid channel ($M_{fr}(b)$) 232 may be a function of the frequency-domain reference channel ($L_{fr}(b)$) 224 and the adjusted frequency-domain target channel ($R_{fr}(b)$) 230. For example, the mid channel ($M_{fr}(b)$) 232 may be expressed as $M_{fr}(b)=(L_{fr}(b)+R_{fr}(b))/2$. According to another implementation, the mid channel ($M_{fr}(b)$) 232 may be expressed as $M_{fr}(b)=c_1(b)*L_{fr}(b)+c_2*R_{fr}(b)$, where $c_1(b)$ and $c_2(b)$ are complex values. In some implementations, the complex values $c_1(b)$ and $c_2(b)$ are based on stereo parameters (e.g., inter-channel phase difference (IPD) parameters). For example, in one implementation, $c_1(b)=(\cos(-\gamma)-i*\sin(-\gamma))/2^{0.5}$ and $c_2(b)=(\cos(IPD(b)-\gamma)+i*\sin(IPD(b)-\gamma))/2^{0.5}$, where i is the imaginary number signifying the square root of −1. The mid channel 232 is provided to the residual generation unit 210 and to the mid channel encoder 214.

The side channel ($S_{fr}(b)$) 234 may also be a function of the frequency-domain reference channel ($L_{fr}(b)$) 224 and the adjusted frequency-domain target channel ($R_{fr}(b)$) 230. For example, the side channel ($S_{fr}(b)$) 234 may be expressed as $S_{fr}(b)=(L_{fr}(b)-R_{fr}(b))/2$. According to another implementation, the side channel ($S_{fr}(b)$) 234 may be expressed as $S_{fr}(b)=(L_{fr}(b)-c(b)*R_{fr}(b))/(1+c(b))$, where c(b) may be the inter-channel level difference (ILD(b)) or a function of the ILD(b) (e.g., $c(b)=10\hat{}(ILD(b)/20)$). The side channel 234 is provided to the residual generation unit 210 and to the residual scaling unit 212. In some implementations, the side channel 234 is provided to the residual channel encoder 216. In some implementations, the residual channel is the same as the side channel.

The residual generation unit 210 is configured to generate a predicted side channel 236 based on the mid channel 232. The predicted side channel 236 corresponds to a prediction of the side channel 234. For example, the predicted side channel (g) 236 may be expressed as $\hat{S}=g*M_{fr}(b)$, where g is a prediction residual gain computed for each parameter band and is a function of the ILDs. The residual generation unit 210 is further configured to generate a residual channel 238 based on the side channel 234 and the predicted side channel 236. For example the residual channel (e) 238 may be an error signal that is expressed as $e=S_{fr}(b)-\hat{S}=S_{fr}(b)-g*M_{fr}(b)$. According to some implementations, the predicted side channel 236 may be equal to zero (or may not be estimated) in certain frequency bands. Thus, in some scenarios (or frequency bands), the residual channel 238 is the same as the side channel 234. The residual channel 238 is provided to the residual scaling unit 212. According to some implementations, the down-mixer 208 generates the residual channel 238 based on the frequency-domain reference channel 224 and the adjusted frequency-domain target channel 230.

If the inter-channel mismatch value 228 between the frequency-domain reference channel 224 and the frequency-domain target channel 226 satisfies a threshold (e.g., is relatively large), analysis windows and synthesis windows used for DFT parameter estimation may be substantially mismatched. If one of the windows is causally shifted and the other window is non-causally shifted, a large temporal mismatch is more forgiving. However, if the frequency-domain target channel 226 is the only channel shifted based on the inter-channel mismatch value 228, the mid channel 232 and the side channel 234 may demonstrate an increase in inter-harmonic noise or spectral leakage. The inter-harmonic noise is more dominant in the side channel 234 when the window rotation is relatively large (e.g., greater than 2 milliseconds). As a result, the residual scaling unit 212 scales (e.g., attenuates) the residual channel 238 prior to coding.

To illustrate, the residual scaling unit 212 is configured to determine a scaling factor 240 for the residual channel 238 based on the inter-channel mismatch value 228. The larger the inter-channel mismatch value 228, the larger the scaling factor 240 (e.g., the more the residual channel 238 is attenuated). According to one implementation, the scaling factor (fac_att) 240 is determined using the following pseudocode:

```
fac_att=1.0f;
  if (fabs(hStereoDft->itd[k_offset])>80.00
  {
    fac_att=min(1.0f, max(0.2f, 2.6f−0.02f*fabs(hStereo-
      Dft->itd[1])));
  }
  pDFT_RES[2*i]*=fac_att;
  pDFT_RES[2*i+1]*=fac_att;
```

Thus, the scaling factor 240 may be determined based on the inter-channel mismatch value 228 (e.g., itd[k_offset]) being greater than a threshold (e.g., 80). The residual scaling unit 212 is further configured to scale the residual channel 238 by the scaling factor 240 to generate a scaled residual channel 242. Thus, the residual scaling unit 212 attenuates the residual channel 238 (e.g., the error signal) if the inter-channel mismatch value 228 is substantially large, because the side channel 234 demonstrates a high amount of spectral leakage in some scenarios. The scaled residual channel 242 is provided to the residual channel encoder 216.

According to some implementations, the residual scaling unit 212 is configured to determine a residual gain parameter based on the inter-channel mismatch value 228. The residual scaling unit 212 may also be configured to zero out one or more bands of the residual channel 238 based on the inter-channel mismatch value 228. According to one implementation, the residual scaling unit 212 is configured to zero out (or substantially zero out) each band of the residual channel 238 based on the inter-channel mismatch value 228.

The mid channel encoder 214 is configured to encode the mid channel 232 to generate an encoded mid channel 244. The encoded mid channel 244 is provided to a multiplexer (MUX) 218. The residual channel encoder 216 is configured to encode the scaled residual channel 242, the residual channel 238, or the side channel 234 to generate an encoded residual channel 246. The encoded residual channel 246 is provided to the multiplexer 218. The multiplexer 218 may combine the encoded mid channel 244 and the encoded residual channel 246 as part of a bitstream 248A. According to one implementation, the bitstream 248A corresponds to (or is included in) the bitstream 248 of FIG. 1.

According to one implementation, the residual channel encoder 216 is configured to set a number of bits used to encode the scaled residual channel 242 in the bitstream 248A based on the inter-channel mismatch value 228. The residual channel encoder 216 may compare the inter-channel mismatch value 228 to a threshold. If the inter-channel mismatch value is less than or equal to the threshold, a first number of bits is used to encode the scaled residual channel 242. If the inter-channel mismatch value 228 is greater than the threshold, a second number of bits is used to encode the scaled residual channel 242. The second number of bits is different from the first number of bits. For example, the second number of bits is less than the first number of bits.

Referring back to FIG. 1, the signal-adaptive "flexible" stereo coder 109 may transform one or more time-domain channels (e.g., reference channel 220 and the target channel 222) into frequency-domain channels (e.g., the frequency-domain reference channel 224 and the frequency-domain target channel 226). For example, the signal-adaptive "flexible" stereo coder 109 may perform a first transform operation on the reference channel 222 to generate the frequency-domain reference channel 224. Additionally, the signal-adaptive "flexible" stereo coder 109 may perform a second transform operation on an adjusted version of the target channel 222 (e.g., the target channel 222 shifted in the time domain by an equivalent of the inter-channel mismatch value 228) to generate the adjusted frequency-domain target channel 230.

The signal-adaptive "flexible" stereo coder 109 is further configured to determine whether to perform a second temporal-shift (e.g., non-causal) operation on the adjusted frequency-domain target channel 230 in the transform domain based on the first temporal-shift operation to generate a modified adjusted frequency-domain target channel (not shown). The modified adjusted frequency-domain target channel may correspond to the target channel 222 shifted by a temporal mismatch value and a second temporal-shift value. For example, the encoder 114 may shift the target channel 222 by the temporal mismatch value to generate the adjusted version of the target channel 222, the signal-adaptive "flexible" stereo coder 109 may perform the second transform operation on the adjusted version of the target channel 122 to generate the adjusted frequency-domain target channel, and the signal-adaptive "flexible" stereo coder 109 may temporally shift the adjusted frequency-domain target channel in the transform domain.

The frequency-domain channels 224, 226 may be used to estimate stereo parameters 162 (e.g., parameters that enable rendering of spatial properties associated with the frequency-domain channels 224, 226). Examples of the stereo parameters 162 may include parameters such as inter-channel intensity difference (IID) parameters (e.g., inter-channel level differences (ILDs)), inter-channel time difference (ITD) parameters, IPD parameters, inter-channel correlation (ICC) parameters, non-causal shift parameters, spectral tilt parameters, inter-channel voicing parameters, inter-channel pitch parameters, inter-channel gain parameters, etc. The stereo parameters 162 may also be transmitted as part of the bitstream 248.

In a similar manner as described with respect to FIG. 2, the signal-adaptive "flexible" coder 109 may predict a side channel $S_{PRED}(b)$ from the mid channel $M_{fr}(b)$ using the information in the mid-band channel $M_{fr}(b)$ and the stereo parameters 162 (e.g., ILDs) corresponding to the band (b). For example, the predicted side-band $S_{PRED}(b)$ may be expressed as $M_{fr}(b)*(ILD(b)-1)/(ILD(b)+1)$. An error signal (e) may be calculated as a function of the side-band channel $S_{fr}$ and the predicted side-band $S_{PRED}$. For example, the error signal e may be expressed as $S_{fr}-S_{PRED}$. The error signal (e) may be coded using time-domain or transform-domain coding techniques to generate a coded error signal $e_{CODED}$. For certain bands, the error signal e may be expressed as a scaled version of a mid-band channel $M\_PAST_{fr}$ in those bands from a previous frame. For example, the coded error signal $e_{CODED}$ may be expressed as $g_{PRED}*M\_PAST_{fr}$, where, in some implementations, $g_{PRED}$ may be estimated such that an energy of $e-g_{PRED}*M\_PAST_{fr}$ is substantially reduced (e.g., minimized). The M_PAST frame that is used can be based on the window shape used for analysis/synthesis and may be constrained to use only even window hops.

In a similar manner as described with respect to FIG. 2, the residual scaling unit 212 may be configured to adjust, modify or encode the residual channel (e.g., side channel or error channel) based on the inter-channel mismatch value 228 between the frequency-domain target channel 226 and the frequency-domain reference channel 224 to reduce inter-harmonic noise introduced by windowing effects in DFT stereo encoding. To illustrate, in one example, the residual scaling unit 212 attenuates the residual channel (e.g., by applying a gain to the side channel or by applying a gain to the error channel) before generating a bit stream for transmission. The residual channel can be completely attenuated, e.g., zeroed, or only partially attenuated.

As another example, a number of bits used to encode the residual channel in the bit stream can be modified. For example, when the temporal misalignment between the target channel and the reference channel is small (e.g., below a threshold), a first number of bits may be allocated for transmission of residual channel information. However, when the temporal misalignment between the target channel and the reference channel is large (e.g., greater a threshold), a second number of bits may be allocated for transmission of residual channel information. The second number is smaller than the first number.

The decoder 118 may perform decoding operations based on the stereo parameters 162, the encoded residual channel 246, and the encoded mid channel 244. For example, IPD information included in the stereo parameters 162 may indicate whether the decoder 118 is to use the IPD parameters. The decoder 118 may generate a first channel and a second channel based on the bitstream 248 and the determination. For example, the frequency-domain stereo decoder 125 and the temporal balancer 124 may perform upmixing to generate a first output channel 126 (e.g., corresponding to reference channel 220), a second output channel 128 (e.g., corresponding to the target channel 222), or both. The second device 106 may output the first output channel 126 via the first loudspeaker 142. The second device 106 may output the second output channel 128 via the second loudspeaker 144. In alternative examples, the first output channel 126 and second output channel 128 may be transmitted as a stereo signal pair to a single output loudspeaker.

It should be noted that the residual scaling unit 212 performs modifications on the residual channel 238 estimated by the residual generation unit 210 based on the inter-channel mismatch value 228. The residual channel encoder 216 encodes the scaled residual channel 242 (e.g., the modified residual signal), and the encoded bitstream 248A is transmitted to the decoder. In certain implementations, the residual scaling unit 212 may reside in the decoder and operations of the residual scaling unit 212 may be bypassed at the encoder. This is possible because the inter-channel mismatch value 228 is available at the decoder because the inter-channel mismatch value 228 is encoded and transmitted to the decoder as a part of the stereo parameters 162. Based on the inter-channel mismatch value 228 available at the decoder, a residual scaling unit residing at the decoder may perform the modifications on the decoded residual channel.

The techniques described with respect to FIGS. 1-2 may adjust, modify, or encode the residual channel (e.g., side channel or error channel) based on the temporal misalignment or mismatch value between the target channel 222 and the reference channel 220 to reduce inter-harmonic noise introduced by windowing effects in DFT stereo encoding. For example, to reduce introduction of artifacts that may be caused by windowing effects in DFT stereo encoding, the residual channel may be attenuated (e.g., a gain is applied), one or more bands of the residual channel may be zeroed, a number of bits used to encode the residual channel may be adjusted, or a combination thereof.

As an example of attenuation, the attenuation factor as a function of the mismatch value may be expressed using the following equation:

$$\text{attenuation\_factor}=2.6-0.02*|\text{mismatch value}|$$

Further, the attenuation factor (e.g., attenuation_factor) calculated according to the above equation can be clipped (or saturated) to stay within a range. As an example, the attenuation factor can be clipped to stay within the limits of 0.2 and 1.0.

Figure 3:
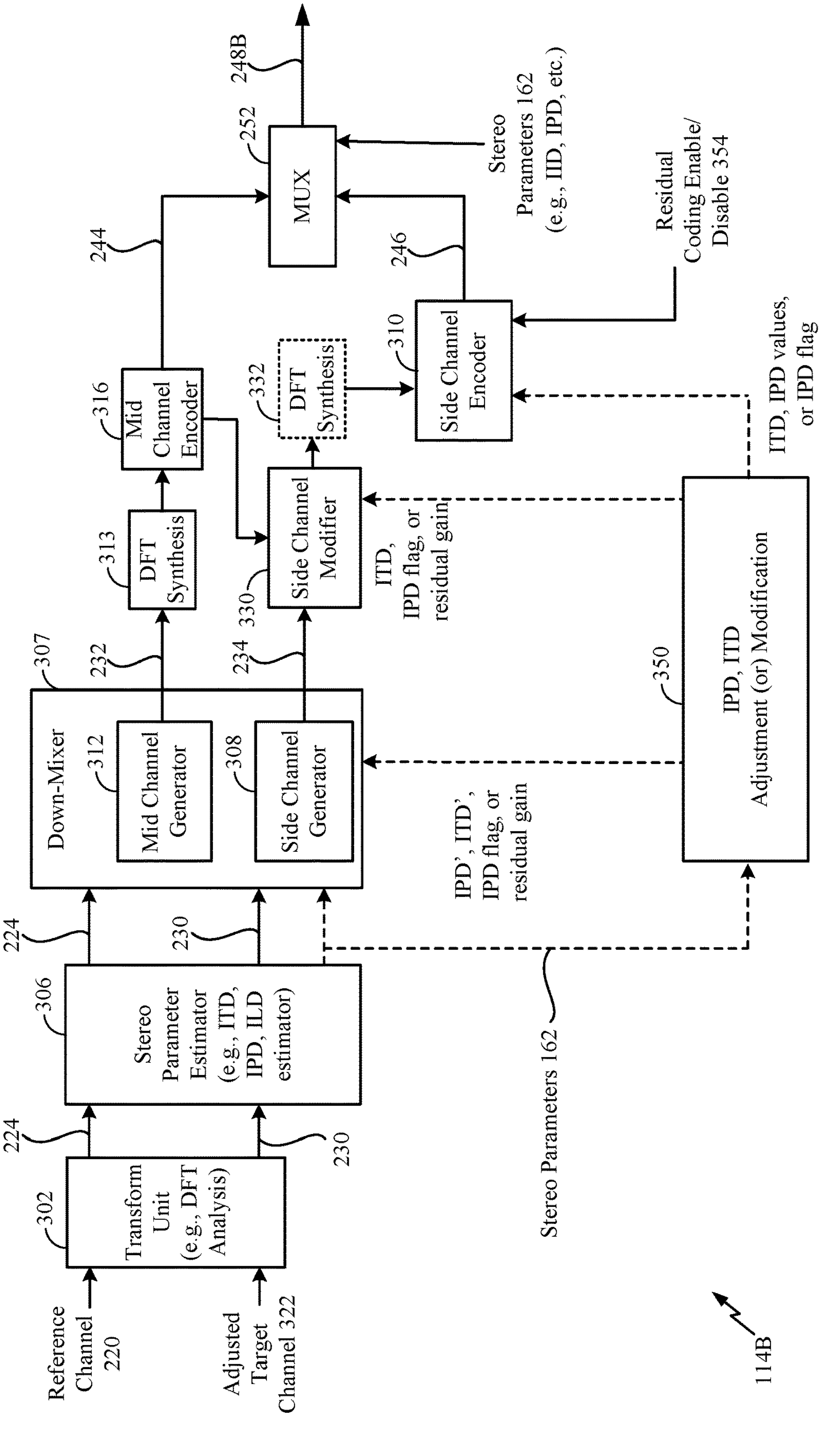
FIG. 3 is a diagram illustrating another example of the encoder of FIG. 1.

Referring to FIG. 3, another example of an encoder 114B is shown. The encoder 114B may correspond to the encoder 114 of FIG. 1. For example, the components described in FIG. 3 may be integrated into the signal-adaptive "flexible" stereo coder 109. It is also to be understood that the various components illustrated in FIG. 3 (e.g., transforms, signal generators, encoders, modifiers, etc.) may be implemented using hardware (e.g., dedicated circuitry), software (e.g., instructions executed by a processor), or a combination thereof.

The reference channel 220 and an adjusted target channel 322 are provided to a transform unit 302. The adjusted target channel 322 may be generated by temporally adjusting the target channel 222 in the time domain by an equivalent of the inter-channel mismatch value 228. Thus, the adjusted target channel 322 is substantially aligned with the reference channel 220. The transform unit 302 may perform a first transform operation on the reference channel 220 to generate the frequency-domain reference channel 224, and the transform unit 302 may perform a second transform on the adjusted target channel 322 to generate the adjusted frequency-domain target channel 230.

Thus, the transform unit 302 may generate frequency-domain (or sub-band domain or filtered low-band core and high-band bandwidth extension) channels. As non-limiting examples, the transform unit 302 may perform DFT operations, FFT operations, MDCT operations, etc. According to some implementations, Quadrature Mirror Filterbank (QMF) operations (using filterbands, such as a Complex Low Delay Filter Bank) may be used to split the input channels 220, 322 into multiple sub-bands. The signal-adaptive "flexible" stereo coder 109 is further configured to determine whether to perform a second temporal-shift (e.g., non-causal) operation on the adjusted frequency-domain target channel 230 in the transform-domain based on the first temporal-shift operation to generate a modified adjusted frequency-domain target channel. The frequency domain-reference channel 224 and the adjusted frequency-domain target channel 230 are provided to a stereo parameter estimator 306 and to a down-mixer 307.

The stereo parameter estimator 206 may extract (e.g., generate) the stereo parameters 162 based on the frequency-domain reference channel 224 and the adjusted frequency-domain target channel 230. To illustrate, IID(b) may be a function of the energies $E_L(b)$ of the left channels in the band (b) and the energies $E_R(b)$ of the right channels in the band (b). For example, IID(b) may be expressed as $20*\log_{10}(E_L(b)/E_R(b))$. IPDs estimated and transmitted at an encoder may provide an estimate of the phase difference in the frequency domain between the left and right channels in the band (b). The stereo parameters 162 may include additional (or alternative) parameters, such as ICCs, ITDs etc. The stereo parameters 162 may be transmitted to the second device 106 of FIG. 1, provided to a down-mixer 207 (e.g., a side channel generator 308), or both. In some implementations, the stereo parameters 162 may optionally be provided to a side channel encoder 310.

The stereo parameters 162 may be provided to an IPD, ITD adjustor (or modifier) 350. In some implementations, the IPD, ITD adjustor (or modifier) 350 may generate a modified IPD' or a modified ITD'. Additionally or alternatively, the IPD, ITD adjustor (or modifier) 350 may determine a residual gain (e.g., a residual gain value) to be applied to a residual signal (e.g., a side channel). In some implementations, the IPD, ITD adjustor (or modifier) 350 may also determine a value of an IPD flag. A value of the IPD flag indicates whether or not IPD values for one or more bands are to be disregarded or zeroed. For example, IPD values for one or more bands may be disregarded or zeroed when the IPD flag is asserted.

The IPD, ITD adjustor (or modifier) 350 may provide the modified IPD', the modified ITD', the IPD flag, the residual gain, or a combination thereof, to the down-mixer 307 (e.g., the side channel generator 308). The IPD, ITD adjustor (or modifier) 350 may provide the ITD, the IPD flag, the residual gain, or a combination thereof, to the side channel modifier 330. The IPD, ITD adjustor (or modifier) 350 may provide the ITD, the IPD values, the IPD flag, or a combination thereof, to the side channel encoder 310.

The frequency-domain reference channel 224 and the adjusted frequency-domain target channel 230 may be provided to the down-mixer 307. The down-mixer 307 includes a mid channel generator 312 and the side channel generator 308. According to some implementations, the stereo parameters 162 may also be provided to the mid channel generator 312. The mid channel generator 312 may generate the mid channel $M_{fr}(b)$ 232 based on the frequency-domain reference channel 224 and the adjusted frequency-domain target channel 230. According to some implementations, the mid channel 232 may be generated also based on the stereo parameters 162. Some methods of generation of the mid channel 232 based on the frequency-domain reference channel 224, the adjusted frequency-domain target channel 230, and the stereo parameters 162 are as follows include $M_{fr}(b)=(L_{fr}(b)+R_{fr}(b))/2$ or $M_{fr}(b)=c_1(b)*L_{fr}(b)+c_2*R_{fr}(b)$, where $c_1(b)$ and $c_2(b)$ are complex values. In some implementations, the complex values $c_1(b)$ and $c_2(b)$ are based on the stereo parameters 162. For example, in one implementation of mid side downmix when IPDs are estimated, $c_1(b)=(\cos(-\gamma)-i*\sin(-\gamma))/2^{0.5}$ and $c_2(b)=(\cos(IPD(b)-\gamma)+i*\sin(IPD(b)-\gamma))/2^{0.5}$ where i is the imaginary number signifying the square root of −1.

The mid channel 232 is provided to a DFT synthesizer 313. The DFT synthesizer 313 provides an output to a mid channel encoder 316. For example, the DFT synthesizer 313 may synthesize the mid channel 232. The synthesized mid channel may be provided to the mid channel 316. The mid channel encoder 316 may generate the encoded mid channel 244 based on the synthesized mid channel.

The side channel generator 308 may generate the side channel ($S_{fr}(b)$) 234 based on the frequency-domain reference channel 224 and the adjusted frequency-domain target channel 230. The side channel 234 may be estimated in the frequency domain. In each band, the gain parameter (g) may be different and may be based on the interchannel level differences (e.g., based on the stereo parameters 162). For example, the side channel 234 may be expressed as $(L_{fr}(b)-c(b)*R_{fr}(b))/(1+c(b))$, where c(b) may be the ILD(b) or a function of the ILD(b) (e.g., c(b)=10^(ILD(b)/20)). The side channel 234 may be provided to a side channel 330. The side channel modifier 330 also receives ITD, an IPD flag, a residual gain, or a combination thereof, from the IPD, ITD adjustor 350. The side channel modifier 330 generates a modified side channel based on the side channel 234, the frequency-domain mid channel, and one or more of ITD, IPD flag, or the residual gain.

The modified side channel is provided to a DFT synthesizer 332 to generate a synthesized side channel. The synthesized side channel is provided to the side channel encoder 310. The side channel encoder 310 generates the encoded residual channel 246 based on the stereo parameters 162 received from the DFT and the ITD, the IPD values, or the IPD flag received from the IPD, ITD adjustor 350. In some implementations, the side channel encoder 310 receives a residual coding enable/disable signal 354 and selectively generates the encoded residual channel 246 based on the residual coding enable/disable signal 354. To illustrate, when the residual coding enable/disable signal 354 indicates that residual encoding is disabled, the side channel encoder 310 may not generate the encoded side channel 246 for one or more frequency bands.

The multiplexer 352 is configured to generate a bitstream 248B based on the encoded mid channel 244, the encoded residual channel 246, or both. In some implementations, the multiplexer 352 receives the stereo parameters 162 and generates the bitstream 248B based on the stereo parameters 162. The bitstream 248B may correspond to the bitstream 248 of FIG. 1.

Figure 4:
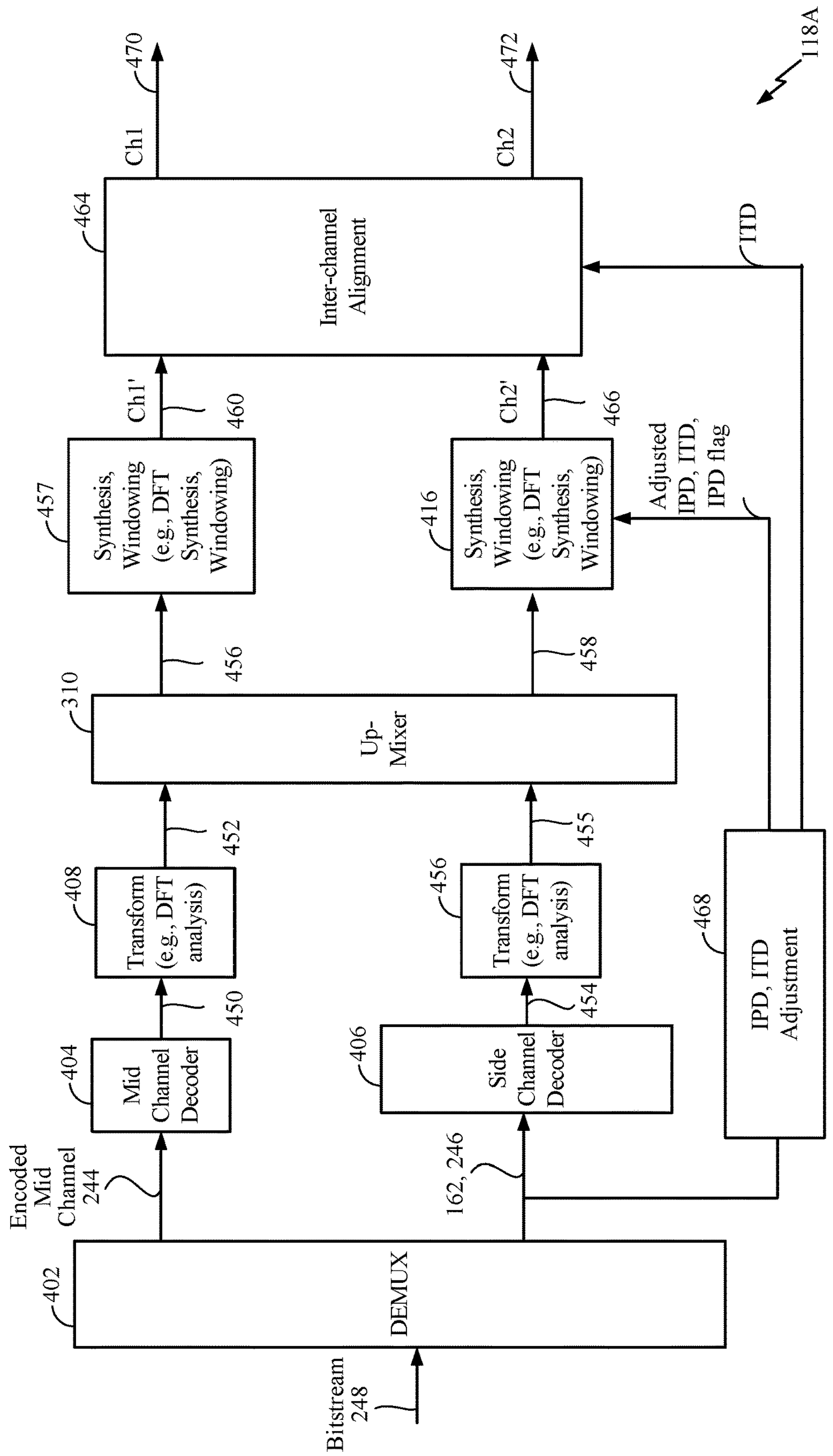
FIG. 4 is a diagram illustrating an example of decoder.

Referring to FIG. 4, an example of a decoder 118A is shown. The decoder 118A may correspond to the decoder 118 of FIG. 1. The bitstream 248 is provided to a demultiplexer (DEMUX) 402 of the decoder 118A. The bitstream 248 includes the stereo parameters 162, the encoded mid channel 244, and the encoded residual channel 246. The demultiplexer 402 is configured to extract the encoded mid channel 244 from the bitstream 248 and to provide the encoded mid channel 244 to a mid channel decoder 404. The demultiplexer 402 is also configured to extract the encoded residual channel 246 and the stereo parameters 162 from the bitstream 248. The encoded residual channel 246 and the stereo parameters 162 are provided to a side channel decoder 406.

The encoded residual channel 246, the stereo parameters 162, or both are provided to an IPD, ITD adjustor 468. The IPD, ITD adjustor 468 is configured to generate identify an IPD flag value included in the bitstream 248 (e.g., encoded residual channel 246 or the stereo parameters 162). The IPD flag may provide an indication as described with reference to FIG. 3. Additionally, or alternatively, the IPD flag may indicate whether or not the decoder 118A is to process or disregard received residual signal information for one or more bands. Based on the IPD flag value (e.g., whether the flag is asserted or not asserted) the IPD, ITD adjuster 468 is configured to adjusted an IPD, adjusted an ITD, or both.

The mid channel decoder 404 may be configured to decode the encoded mid channel 244 to generate a mid channel ($m_{CODED}(t)$) 450. If the mid channel 450 is a time-domain signal, a transform 408 may be applied to the mid channel 450 to generate a frequency-domain mid channel ($M_{CODED}(b)$) 452. The frequency-domain mid channel 452 may be provided to an up-mixer 410. However, if the mid channel 450 is a frequency-domain signal, the mid channel 450 may be provided directly to the up-mixer 410.

The side channel decoder 406 may generate a side channel ($S_{CODED}$(b)) 454 based on the encoded residual channel 246 and the stereo parameters 162. For example, the error (e) may be decoded for the low-bands and the high-bands. The side channel 454 may be expressed as SPIED(b)+$e_{CODED}$(b), where SPIED(b)=$M_{CODED}$(b)*(ILD(b)−1)/(ILD(b)+1). In some implementations, the side channel decoder 406 generates the side channel 454 further based on the IPD flag. A transform 456 may be applied to the side channel 454 to generate a frequency-domain side channel ($S_{CODED}$(b)) 455. The frequency-domain side channel 455 may also be provided to the up-mixer 410.

The up-mixer 410 may perform an up-mix operation on the mid channel 452 and the side channel 455. For example, the up-mixer 410 may generate a first up-mixed channel ($L_{fr}$) 456 and a second up-mixed channel ($R_{fr}$) 458 based on the mid channel 452 and the side channel 455. Thus, in the described example, the first up-mixed signal 456 may be a left-channel signal, and the second up-mixed signal 458 may be a right-channel signal. The first up-mixed signal 456 may be expressed as $M_{CODED}$(b)+$S_{CODED}$(b), and the second up-mixed signal 458 may be expressed as $M_{CODED}$(b)−$S_{CODED}$(b).

A synthesis, windowing operation 457 is performed on the first up-mixed signal 456 to generate a synthesized first up-mixed signal 460. The synthesized first up-mixed signal 460 is provided to an inter-channel aligner 464. A synthesis, windowing operation 416 is performed on the second up-mixed signal 458 to generate a synthesized second up-mixed signal 466. The synthesized second up-mixed signal 466 is provided to an inter-channel aligner 464. The inter-channel aligner 464 may align the synthesized first up-mixed signal 460 and the synthesized second up-mixed signal 466 to generate a first output signal 470 and a second output signal 472.

It is noted that the encoder 114A of FIG. 2, the encoder 114B of FIG. 3 and the decoder 118A of FIG. 4 may include a portion, but not all, of an encoder or decoder framework. For example, the encoder 114A of FIG. 2, the encoder 114B of FIG. 3, the decoder 118A of FIG. 4, or a combination thereof, may also include a parallel path of high band (HB) processing. Additionally, or alternatively, in some implementations, a time domain downmix may be performed at the encoders 114A, 114B. Additionally, or alternatively, a time domain upmix may follow the decoder 118A of FIG. 4 to obtain decoder shift compensated Left and Right channels.

Referring to FIG. 5, a method 500 of communication is shown. The method 500 may be performed by the first device 104 of FIG. 1, the encoder 114 of FIG. 1, the encoder 114A of FIG. 2, the encoder 114B of FIG. 3, or a combination thereof.

The method 500 includes performing, at an encoder, a first transform operation on a reference channel to generate a frequency-domain reference channel, at 502. For example, referring to FIG. 2, the transform unit 202 performs the first transform operation on the reference channel 220 to generate the frequency-domain reference channel 224. The first transform operation may include DFT operations, FFT operations, MDCT operations, etc.

The method 500 also includes performing a second transform operation on a target channel to generate a frequency-domain target channel, at 504. For example, referring to FIG. 2, the transform unit 204 performs the second transform operation on the target channel 222 to generate the frequency-domain target channel 226. The second transform operation may include DFT operations, FFT operations, MDCT operations, etc.

The method 500 also includes determining an inter-channel mismatch value indicative of a temporal misalignment between the frequency-domain reference channel and the frequency-domain target channel, at 506. For example, referring to FIG. 2, the stereo channel adjustment unit 206 determines the inter-channel mismatch value 228 that is indicative of the temporal misalignment between the frequency-domain reference channel 224 and the frequency-domain target channel 226. Thus, the inter-channel mismatch value 228 may be an inter-channel time difference (ITD) parameter that indicates (in a frequency domain) how much the target channel 222 lags the reference channel 220.

The method 500 also includes adjusting the frequency-domain target channel based on the inter-channel mismatch value to generate an adjusted frequency-domain target channel, at 508. For example, referring to FIG. 2, the stereo channel adjustment unit 206 adjusts the frequency-domain target channel 226 based on the inter-channel mismatch value 228 to generate the adjusted frequency-domain target channel 230. To illustrate, the stereo channel adjustment unit 206 shifts the frequency-domain target channel 226 by the inter-channel mismatch value 228 to generate the adjusted frequency-domain target channel 230 that is temporally in synchronization with the frequency-domain reference channel 224.

The method 500 also includes performing a down-mix operation on the frequency-domain reference channel and the adjusted frequency-domain target channel to generate a mid channel and a side channel, at 510. For example, referring to FIG. 2, the down-mixer 208 performs the down-mix operation on the frequency-domain reference channel 224 and the adjusted frequency-domain target channel 230 to generate a mid channel 232 and a side channel 234. The mid channel ($M_{fr}$(b)) 232 may be a function of the frequency-domain reference channel ($L_{fr}$(b)) 224 and the adjusted frequency-domain target channel ($R_{fr}$(b)) 230. For example, the mid channel ($M_{fr}$(b)) 232 may be expressed as $M_{fr}(b)=(L_{fr}(b)+R_{fr}(b))/2$. The side channel ($S_{fr}$(b)) 234 may also be a function of the frequency-domain reference channel ($L_{fr}$(b)) 224 and the adjusted frequency-domain target channel ($R_{fr}$(b)) 230. For example, the side channel ($S_{fr}$(b)) 234 may be expressed as $S_{fr}(b)=(L_{fr}(b)-R_{fr}(b))/2$.

The method 500 also includes generating a predicted side channel based on the mid channel, at 512. The predicted side channel corresponds to a prediction of the side channel. For example, referring to FIG. 2, the residual generation unit 210 generates the predicted side channel 236 based on the mid channel 232. The predicted side channel 236 corresponds to a prediction of the side channel 234. For example, the predicted side channel ($\hat{S}$) 236 may be expressed as $\hat{S}=g*M_{fr}(b)$, where g is a prediction residual gain computed for each parameter band and is a function of the ILDs.

The method 500 also includes generating a residual channel based on the side channel and the predicted side channel, at 514. For example, referring to FIG. 2, the residual generation unit 210 generates the residual channel 238 based on the side channel 234 and the predicted side channel 236. For example the residual channel (e) 238 may be an error signal that is expressed as $e=S_{fr}(b)-\hat{S}=S_{fr}(b)-g*M_{fr}(b)$.

The method 500 also includes determining a scaling factor for the residual channel based on the inter-channel mismatch value, at 516. For example, referring to FIG. 2, the residual scaling unit 212 determines the scaling factor 212 for the residual channel 238 based on the inter-channel mismatch value 228. The larger the inter-channel mismatch value 228, the larger the scaling factor 240 (e.g., the more the residual channel 238 is attenuated).

The method 500 also includes scaling the residual channel by the scaling factor to generate a scaled residual channel, at 518. For example, referring to FIG. 2, the residual scaling unit 212 scales the residual channel 238 by the scaling factor 240 to generate a scaled residual channel 242. Thus, the residual scaling unit 212 attenuates the residual channel 238 (e.g., the error signal) if the inter-channel mismatch value 228 is substantially large, because side channel 234 demonstrates a high amount of spectral leakage.

The method 500 also includes encoding the mid channel and the scaled residual channel as part of a bitstream, at 520. For example, referring to FIG. 2, the mid channel encoder 214 encodes the mid channel 232 to generate the encoded mid channel 244, and the residual channel encoder 216 encodes the scaled residual channel 242 or the side channel 234 to generate the encoded residual channel 246. The multiplexer 218 combines the encoded mid channel 244 and the encoded residual channel 246 as part of a bitstream 248A.

The method 500 may adjust, modify, or encode the residual channel (e.g., side channel or error channel) based on the temporal misalignment or mismatch value between the target channel 222 and the reference channel 220 to reduce inter-harmonic noise introduced by windowing effects in DFT stereo encoding. For example, to reduce introduction of artifacts that may be caused by windowing effects in DFT stereo encoding, the residual channel may be attenuated (e.g., a gain is applied), one or more bands of the residual channel may be zeroed, a number of bits used to encode the residual channel may be adjusted, or a combination thereof.

Referring to FIG. 6, a block diagram of a particular illustrative example of a device 600 (e.g., a wireless communication device) is shown. In various embodiments, the device 600 may have fewer or more components than illustrated in FIG. 6. In an illustrative embodiment, the device 600 may correspond to the first device 104 of FIG. 1, the second device 106 of FIG. 1, or a combination thereof. In an illustrative embodiment, the device 600 may perform one or more operations described with reference to systems and methods of FIGS. 1-5.

In a particular embodiment, the device 600 includes a processor 606 (e.g., a central processing unit (CPU)). The device 600 may include one or more additional processors 610 (e.g., one or more digital signal processors (DSPs)). The processors 610 may include a media (e.g., speech and music) coder-decoder (CODEC) 608, and an echo canceller 612. The media CODEC 608 may include the decoder 118, the encoder 114, or a combination thereof. The encoder 114 may include the residual generation unit 210 and the residual scaling unit 212.

The device 600 may include the memory 153 and a CODEC 634. Although the media CODEC 608 is illustrated as a component of the processors 610 (e.g., dedicated circuitry and/or executable programming code), in other embodiments one or more components of the media CODEC 608, such as the decoder 118, the encoder 114, or a combination thereof, may be included in the processor 606, the CODEC 634, another processing component, or a combination thereof.

The device 600 may include the transmitter 110 coupled to an antenna 642. The device 600 may include a display 628 coupled to a display controller 626. One or more speakers 648 may be coupled to the CODEC 634. One or more microphones 646 may be coupled, via the input interface(s) 112, to the CODEC 634. In a particular implementation, the speakers 648 may include the first loudspeaker 142, the second loudspeaker 144 of FIG. 1, or a combination thereof. In a particular implementation, the microphones 646 may include the first microphone 146, the second microphone 148 of FIG. 1, or a combination thereof. The CODEC 634 may include a digital-to-analog converter (DAC) 602 and an analog-to-digital converter (ADC) 604.

The memory 153 may include instructions 660 executable by the processor 606, the processors 610, the CODEC 634, another processing unit of the device 600, or a combination thereof, to perform one or more operations described with reference to FIGS. 1-5.

One or more components of the device 600 may be implemented via dedicated hardware (e.g., circuitry), by a processor executing instructions to perform one or more tasks, or a combination thereof. As an example, the memory 153 or one or more components of the processor 606, the processors 610, and/or the CODEC 634 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). The memory device may include instructions (e.g., the instructions 660) that, when executed by a computer (e.g., a processor in the CODEC 634, the processor 606, and/or the processors 610), may cause the computer to perform one or more operations described with reference to FIGS. 1-4. As an example, the memory 153 or the one or more components of the processor 606, the processors 610, and/or the CODEC 634 may be a non-transitory computer-readable medium that includes instructions (e.g., the instructions 660) that, when executed by a computer (e.g., a processor in the CODEC 634, the processor 606, and/or the processors 610), cause the computer perform one or more operations described with reference to FIGS. 1-5.

In a particular embodiment, the device 600 may be included in a system-in-package or system-on-chip device (e.g., a mobile station modem (MSM)) 622. In a particular embodiment, the processor 606, the processors 610, the display controller 626, the memory 153, the CODEC 634, and the transmitter 110 are included in a system-in-package or the system-on-chip device 622. In a particular embodiment, an input device 630, such as a touchscreen and/or keypad, and a power supply 644 are coupled to the system-on-chip device 622. Moreover, in a particular embodiment, as illustrated in FIG. 6, the display 628, the input device 630, the speakers 648, the microphones 646, the antenna 642, and the power supply 644 are external to the system-on-chip device 622. However, each of the display 628, the input device 630, the speakers 648, the microphones 646, the antenna 642, and the power supply 644 can be coupled to a component of the system-on-chip device 622, such as an interface or a controller.

The device 600 may include a wireless telephone, a mobile communication device, a mobile phone, a smart phone, a cellular phone, a laptop computer, a desktop computer, a computer, a tablet computer, a set top box, a personal digital assistant (PDA), a display device, a television, a gaming console, a music player, a radio, a video player, an entertainment unit, a communication device, a fixed location data unit, a personal media player, a digital video player, a digital video disc (DVD) player, a tuner, a camera, a navigation device, a decoder system, an encoder system, or any combination thereof.

In conjunction with the techniques described above, an apparatus includes means for performing a first transform operation on a reference channel to generate a frequency-domain reference channel. For example, the means for performing the first transform operation may include the transform unit 202 of FIGS. 1-2, one or more components of the encoder 114B of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for performing a second transform operation on a target channel to generate a frequency-domain target channel. For example, the means for performing the second transform operation may include the transform unit 204 of FIGS. 1-2, one or more components of the encoder 114B of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for determining an inter-channel mismatch value indicative of a temporal misalignment between the frequency-domain reference channel and the frequency-domain target channel. For example, the means for determining the inter-channel mismatch value may include the stereo channel adjustment unit 206 of FIGS. 1-2, one or more components of the encoder 114B of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for adjusting the frequency-domain target channel based on the inter-channel mismatch value to generate an adjusted frequency-domain target channel. For example, the means for adjusting the frequency-domain target channel may include the stereo channel adjustment unit 206 of FIGS. 1-2, one or more components of the encoder 114B of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for performing a down-mix operation on the frequency-domain reference channel and the adjusted frequency-domain target channel to generate a mid channel and a side channel. For example, the means for performing the down-mix operation may include the down-mixer 208 of FIGS. 1-2, the down-mixer 307 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for generating a predicted side channel based on the mid channel. The predicted side channel corresponds to a prediction of the side channel. For example, the means for generating the predicted side channel may include the residual generation unit 210 of FIGS. 1-2, the IPD, ITD adjuster or modifier 350 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for generating a residual channel based on the side channel and the predicted side channel. For example, the means for generating the residual channel may include the residual generation unit 210 of FIGS. 1-2, the IPD, ITD adjuster or modifier 350 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for determining a scaling factor for the residual channel based on the inter-channel mismatch value. For example, the means for determining the scaling factor may include the residual scaling unit 212 of FIGS. 1-2, the IPD, ITD adjuster or modifier 350 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for scaling the residual channel by the scaling factor to generate a scaled residual channel. For example, the means for scaling the residual channel may include the residual scaling unit 212 of FIGS. 1-2, the side channel modifier 330 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

The apparatus also includes means for encoding the mid channel and the scaled residual channel as part of a bitstream. For example, the means for encoding may include the mid channel encoder 214 of FIGS. 1-2, the residual channel encoder 216 of FIGS. 1-2, the mid channel encoder 316 of FIG. 3, the side channel encoder 310 of FIG. 3, the processor 610 of FIG. 6, the processor 606 of FIG. 6, the CODEC 634 of FIG. 6, the instructions 660 executed by one or more processing units, one or more other modules, devices, components, circuits, or a combination thereof.

In a particular implementation, one or more components of the systems and devices disclosed herein may be integrated into a decoding system or apparatus (e.g., an electronic device, a CODEC, or a processor therein), into an encoding system or apparatus, or both. In other implementations, one or more components of the systems and devices disclosed herein may be integrated into a wireless telephone, a tablet computer, a desktop computer, a laptop computer, a set top box, a music player, a video player, an entertainment unit, a television, a game console, a navigation device, a communication device, a personal digital assistant (PDA), a fixed location data unit, a personal media player, or another type of device.

Referring to FIG. 7, a block diagram of a particular illustrative example of a base station 700 is depicted. In various implementations, the base station 700 may have more components or fewer components than illustrated in FIG. 7. In an illustrative example, the base station 700 may operate according to the method 500 of FIG. 5.

The base station 700 may be part of a wireless communication system. The wireless communication system may include multiple base stations and multiple wireless devices. The wireless communication system may be a Long Term Evolution (LTE) system, a fourth generation (4G) LTE system, a fifth generation (5G) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA.

The wireless devices may also be referred to as user equipment (UE), a mobile station, a terminal, an access terminal, a subscriber unit, a station, etc. The wireless devices may include a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. The wireless devices may include or correspond to the device 600 of FIG. 6.

Various functions may be performed by one or more components of the base station 700 (and/or in other components not shown), such as sending and receiving messages and data (e.g., audio data). In a particular example, the base station 700 includes a processor 706 (e.g., a CPU). The base station 700 may include a transcoder 710. The transcoder 710 may include an audio CODEC 708 (e.g., a speech and music CODEC). For example, the transcoder 710 may include one or more components (e.g., circuitry) configured to perform operations of the audio CODEC 708. As another example, the transcoder 710 is configured to execute one or more computer-readable instructions to perform the operations of the audio CODEC 708. Although the audio CODEC 708 is illustrated as a component of the transcoder 710, in other examples one or more components of the audio CODEC 708 may be included in the processor 706, another processing component, or a combination thereof. For example, the decoder 118 (e.g., a vocoder decoder) may be included in a receiver data processor 764. As another example, the encoder 114 (e.g., a vocoder encoder) may be included in a transmission data processor 782.

The transcoder 710 may function to transcode messages and data between two or more networks. The transcoder 710 is configured to convert message and audio data from a first format (e.g., a digital format) to a second format. To illustrate, the decoder 118 may decode encoded signals having a first format and the encoder 114 may encode the decoded signals into encoded signals having a second format. Additionally or alternatively, the transcoder 710 is configured to perform data rate adaptation. For example, the transcoder 710 may downconvert a data rate or upconvert the data rate without changing a format of the audio data. To illustrate, the transcoder 710 may downconvert 64 kbit/s signals into 16 kbit/s signals. The audio CODEC 708 may include the encoder 114 and the decoder 118. The decoder 118 may include the stereo parameter conditioner 618.

The base station 700 includes a memory 732. The memory 732 (an example of a computer-readable storage device) may include instructions. The instructions may include one or more instructions that are executable by the processor 706, the transcoder 710, or a combination thereof, to perform the method 500 of FIG. 5. The base station 700 may include multiple transmitters and receivers (e.g., transceivers), such as a first transceiver 752 and a second transceiver 754, coupled to an array of antennas. The array of antennas may include a first antenna 742 and a second antenna 744. The array of antennas is configured to wirelessly communicate with one or more wireless devices, such as the device 600 of FIG. 6. For example, the second antenna 744 may receive a data stream 714 (e.g., a bitstream) from a wireless device. The data stream 714 may include messages, data (e.g., encoded speech data), or a combination thereof.

The base station 700 may include a network connection 760, such as a backhaul connection. The network connection 760 is configured to communicate with a core network or one or more base stations of the wireless communication network. For example, the base station 700 may receive a second data stream (e.g., messages or audio data) from a core network via the network connection 760. The base station 700 may process the second data stream to generate messages or audio data and provide the messages or the audio data to one or more wireless devices via one or more antennas of the array of antennas or to another base station via the network connection 760. In a particular implementation, the network connection 760 may be a wide area network (WAN) connection, as an illustrative, non-limiting example. In some implementations, the core network may include or correspond to a Public Switched Telephone Network (PSTN), a packet backbone network, or both.

The base station 700 may include a media gateway 770 that is coupled to the network connection 760 and the processor 706. The media gateway 770 is configured to convert between media streams of different telecommunications technologies. For example, the media gateway 770 may convert between different transmission protocols, different coding schemes, or both. To illustrate, the media gateway 770 may convert from PCM signals to Real-Time Transport Protocol (RTP) signals, as an illustrative, non-limiting example. The media gateway 770 may convert data between packet switched networks (e.g., a Voice Over Internet Protocol (VoIP) network, an IP Multimedia Subsystem (IMS), a fourth generation (4G) wireless network, such as LTE, WiMax, and UMB, a fifth generation (5G) wireless network, etc.), circuit switched networks (e.g., a PSTN), and hybrid networks (e.g., a second generation (2G) wireless network, such as GSM, GPRS, and EDGE, a third generation (3G) wireless network, such as WCDMA, EV-DO, and HSPA, etc.).

Additionally, the media gateway 770 may include a transcoder, such as the transcoder 710, and is configured to transcode data when codecs are incompatible. For example, the media gateway 770 may transcode between an Adaptive Multi-Rate (AMR) codec and a G.711 codec, as an illustrative, non-limiting example. The media gateway 770 may include a router and a plurality of physical interfaces. In some implementations, the media gateway 770 may also include a controller (not shown). In a particular implementation, the media gateway controller may be external to the media gateway 770, external to the base station 700, or both. The media gateway controller may control and coordinate operations of multiple media gateways. The media gateway 770 may receive control signals from the media gateway controller and may function to bridge between different transmission technologies and may add service to end-user capabilities and connections.

The base station 700 may include a demodulator 762 that is coupled to the transceivers 752, 754, the receiver data processor 764, and the processor 706, and the receiver data processor 764 may be coupled to the processor 706. The demodulator 762 is configured to demodulate modulated signals received from the transceivers 752, 754 and to provide demodulated data to the receiver data processor 764. The receiver data processor 764 is configured to extract a message or audio data from the demodulated data and send the message or the audio data to the processor 706.

The base station 700 may include a transmission data processor 782 and a transmission multiple input-multiple output (MIMO) processor 784. The transmission data processor 782 may be coupled to the processor 706 and to the transmission MIMO processor 784. The transmission MIMO processor 784 may be coupled to the transceivers 752, 754 and the processor 706. In some implementations, the transmission MIMO processor 784 may be coupled to the media gateway 770. The transmission data processor 782 is configured to receive the messages or the audio data from the processor 706 and to code the messages or the audio data based on a coding scheme, such as CDMA or orthogonal frequency-division multiplexing (OFDM), as an illustrative, non-limiting examples. The transmission data processor 782 may provide the coded data to the transmission MIMO processor 784.

The coded data may be multiplexed with other data, such as pilot data, using CDMA or OFDM techniques to generate multiplexed data. The multiplexed data may then be modulated (i.e., symbol mapped) by the transmission data processor 782 based on a particular modulation scheme (e.g., Binary phase-shift keying ("BPSK"), Quadrature phase-shift keying ("QSPK"), M-ary phase-shift keying ("M-PSK"), M-ary Quadrature amplitude modulation ("M-QAM"), etc.) to generate modulation symbols. In a particular implementation, the coded data and other data may be modulated using different modulation schemes. The data rate, coding, and modulation for each data stream may be determined by instructions executed by processor 706.

The transmission MIMO processor 784 is configured to receive the modulation symbols from the transmission data processor 782 and may further process the modulation symbols and may perform beamforming on the data. For example, the transmission MIMO processor 784 may apply beamforming weights to the modulation symbols.

During operation, the second antenna 744 of the base station 700 may receive a data stream 714. The second transceiver 754 may receive the data stream 714 from the second antenna 744 and may provide the data stream 714 to the demodulator 762. The demodulator 762 may demodulate modulated signals of the data stream 714 and provide demodulated data to the receiver data processor 764. The receiver data processor 764 may extract audio data from the demodulated data and provide the extracted audio data to the processor 706.

The processor 706 may provide the audio data to the transcoder 710 for transcoding. The decoder 118 of the transcoder 710 may decode the audio data from a first format into decoded audio data, and the encoder 114 may encode the decoded audio data into a second format. In some implementations, the encoder 114 may encode the audio data using a higher data rate (e.g., upconvert) or a lower data rate (e.g., downconvert) than received from the wireless device. In other implementations, the audio data may not be transcoded. Although transcoding (e.g., decoding and encoding) is illustrated as being performed by a transcoder 710, the transcoding operations (e.g., decoding and encoding) may be performed by multiple components of the base station 700. For example, decoding may be performed by the receiver data processor 764 and encoding may be performed by the transmission data processor 782. In other implementations, the processor 706 may provide the audio data to the media gateway 770 for conversion to another transmission protocol, coding scheme, or both. The media gateway 770 may provide the converted data to another base station or core network via the network connection 760.

Encoded audio data generated at the encoder 114, such as transcoded data, may be provided to the transmission data processor 782 or the network connection 760 via the processor 706. The transcoded audio data from the transcoder 710 may be provided to the transmission data processor 782 for coding according to a modulation scheme, such as OFDM, to generate the modulation symbols. The transmission data processor 782 may provide the modulation symbols to the transmission MIMO processor 784 for further processing and beamforming. The transmission MIMO processor 784 may apply beamforming weights and may provide the modulation symbols to one or more antennas of the array of antennas, such as the first antenna 742 via the first transceiver 752. Thus, the base station 700 may provide a transcoded data stream 716, that corresponds to the data stream 714 received from the wireless device, to another wireless device. The transcoded data stream 716 may have a different encoding format, data rate, or both, than the data stream 714. In other implementations, the transcoded data stream 716 may be provided to the network connection 760 for transmission to another base station or a core network.

It should be noted that various functions performed by the one or more components of the systems and devices disclosed herein are described as being performed by certain components or modules. This division of components and modules is for illustration only. In an alternate implementation, a function performed by a particular component or module may be divided amongst multiple components or modules. Moreover, in an alternate implementation, two or more components or modules may be integrated into a single component or module. Each component or module may be implemented using hardware (e.g., a field-programmable gate array (FPGA) device, an application-specific integrated circuit (ASIC), a DSP, a controller, etc.), software (e.g., instructions executable by a processor), or any combination thereof.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A device comprising:

a processor configured to:

determine an inter-channel mismatch value indicative of a temporal misalignment between a frequency-domain reference channel and a frequency-domain target channel;

adjust the frequency-domain target channel based on the inter-channel mismatch value to generate an adjusted frequency-domain target channel;

perform a down-mix operation, based on the frequency-domain reference channel and the adjusted frequency-domain target channel, to generate a mid channel and a side channel;

generate a predicted side channel based on the mid channel;

generate a residual channel based on the side channel and the predicted side channel; and encode the residual channel as part of a bitstream; and a memory configured to store the inter-channel mismatch value.

2. The device of claim 1, wherein the processor is further configured to scale the residual channel by a scaling factor to generate a scaled residual channel, wherein the residual channel is encoded as part of the bitstream by encoding the scaled residual channel as part of the bitstream.

3. The device of claim 2, wherein the scaling factor is based on the inter-channel mismatch value.

4. The device of claim 2, wherein the processor is further configured to set a number of bits used to encode the scaled residual channel in the bitstream based on the inter-channel mismatch value.

5. The device of claim 2, wherein the processor is further configured to compare the inter-channel mismatch value to a threshold.

6. The device of claim 5, wherein, in response to the inter-channel mismatch value being less than or equal to the threshold, a first number of bits is used to encode the scaled residual channel.

7. The device of claim 6, wherein, in response to the inter-channel mismatch value being greater than the threshold, a second number of bits is used to encode the scaled residual channel.

8. The device of claim 7, wherein the second number of bits is different from the first number of bits.

9. The device of claim 7, wherein the second number of bits is less than the first number of bits.

10. The device of claim 1, wherein the processor is further configured to determine a residual gain parameter based on the inter-channel mismatch value.

11. The device of claim 1, wherein one or more bands of the residual channel are zeroed out based on the inter-channel mismatch value.

12. The device of claim 1, wherein each band of the residual channel is zeroed out based on the inter-channel mismatch value.

13. The device of claim 1, wherein the processor is further configured to:

perform a first transform operation on a reference channel to generate the frequency-domain reference channel; and perform a second transform operation on a target channel to generate the frequency-domain target channel.

14. The device of claim 1, wherein the processor is further configured to encode the mid channel as part of the bitstream.

15. The device of claim 1, wherein the residual channel comprises an error channel signal.

16. The device of claim 1, wherein the processor and the memory are integrated into a mobile device.

17. The device of claim 1, wherein the processor and memory are integrated into a base station.

18. The device of claim 1, further comprising a transmitter configured to transmit the bitstream.

19. A method of communication, the method comprising:

determining an inter-channel mismatch value indicative of a temporal misalignment between a frequency-domain reference channel and a frequency-domain target channel;

adjusting the frequency-domain target channel based on the inter-channel mismatch value to generate an adjusted frequency-domain target channel;

performing a down-mix operation, based on the frequency-domain reference channel and the adjusted frequency-domain target channel, to generate a mid channel and a side channel;

generating a predicted side channel based on the mid channel;

generating a residual channel based on the side channel and the predicted side channel; and encoding the residual channel as part of a bitstream.

20. The method of claim 19, further comprising scaling the residual channel by a scaling factor to generate a scaled residual channel, wherein encoding the residual channel as part of the bitstream includes encoding the scaled residual channel as part of the bitstream.

21. The method of claim 20, wherein the scaling factor is based on the inter-channel mismatch value.

22. The method of claim 19, wherein one or more bands of the residual channel are zeroed out based on the inter-channel mismatch value.

23. The method of claim 19, wherein each band of the residual channel is zeroed out based on the inter-channel mismatch value.

24. The method of claim 19, wherein adjusting the frequency-domain target channel is performed at a mobile device.

25. The method of claim 19, wherein adjusting the frequency-domain target channel is performed at a base station.

26. A non-transitory computer-readable medium comprising instructions that, when executed by a processor within an encoder, cause the processor to perform operations comprising:

determining an inter-channel mismatch value indicative of a temporal misalignment between a frequency-domain reference channel and a frequency-domain target channel;

adjusting the frequency-domain target channel based on the inter-channel mismatch value to generate an adjusted frequency-domain target channel;

performing a down-mix operation, based on the frequency-domain reference channel and the adjusted frequency-domain target channel, to generate a mid channel and a side channel;

generating a predicted side channel based on the mid channel;

generating a residual channel based on the side channel and the predicted side channel; and encoding the residual channel as part of a bitstream.

27. The non-transitory computer-readable medium of claim 26, wherein the residual channel comprises an error channel signal.

28. An apparatus comprising:

means for adjusting a frequency-domain target channel based on an inter-channel mismatch value to generate an adjusted frequency-domain target channel, the inter-channel mismatch value indicative of a temporal misalignment between a frequency-domain reference channel and the frequency-domain target channel;

means for performing a down-mix operation, based on the frequency-domain reference channel and the adjusted frequency-domain target channel, to generate a mid channel and a side channel; and means for generating a residual channel based on the side channel and a predicted side channel, the residual channel to be encoded as part of a bitstream.

29. The apparatus of claim 28, wherein the means for adjusting the frequency-domain target channel, the means for performing the down-mix operation, and the means for generating the residual channel are integrated into a mobile device.

30. The apparatus of claim 28, wherein the means for adjusting the frequency-domain target channel, the means for performing the down-mix operation, and the means for generating the residual channel are integrated into a base station.

* * * * *